(12) United States Patent
Sano et al.

(10) Patent No.: US 11,393,879 B2
(45) Date of Patent: Jul. 19, 2022

(54) LIGHT-EMITTING DEVICE, DISPLAY DEVICE, PHOTOELECTRIC CONVERSION DEVICE, ELECTRONIC APPARATUS, ILLUMINATION DEVICE, AND MOBILE BODY

(71) Applicant: CANON KABUSHIKI KAISHA, Tokyo (JP)

(72) Inventors: Hiroaki Sano, Yokohama (JP); Koji Ishizuya, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 20 days.

(21) Appl. No.: 17/022,687

(22) Filed: Sep. 16, 2020

(65) Prior Publication Data

US 2021/0118959 A1 Apr. 22, 2021

(30) Foreign Application Priority Data

Oct. 17, 2019 (JP) .............................. JP2019-190459

(51) Int. Cl.
*H01L 27/32* (2006.01)
*H01L 51/52* (2006.01)

(52) U.S. Cl.
CPC ........ *H01L 27/3218* (2013.01); *H01L 27/322* (2013.01); *H01L 27/3223* (2013.01); *H01L 27/3234* (2013.01); *H01L 51/5271* (2013.01)

(58) Field of Classification Search
CPC ............. H01L 51/5265; H01L 51/5218; H01L 51/5271; H01L 27/3223; H01L 27/3216–3218; H01L 27/3234; H01L 27/322

See application file for complete search history.

(56) References Cited

U.S. PATENT DOCUMENTS

| 9,954,201 B2 | 4/2018 | Koshihara et al. |
| 10,236,473 B2 | 3/2019 | Koshihara et al. |
| 2008/0198298 A1* | 8/2008 | Jeong .................... F41J 5/14 349/65 |
| 2017/0236842 A1* | 8/2017 | Matsuda ............. H01L 29/7869 257/43 |
| 2017/0237033 A1* | 8/2017 | Koshihara ............. H01L 51/524 257/88 |
| 2017/0237039 A1 | 8/2017 | Koshihara et al. |

(Continued)

FOREIGN PATENT DOCUMENTS

JP 2017-146374 A 8/2017

*Primary Examiner* — Eric K Ashbahian
(74) *Attorney, Agent, or Firm* — Venable LLP

(57) ABSTRACT

A light-emitting device comprising first and second light-emitting elements in a display region, and first and second dummy elements in a dummy region is provided. Each of the light-emitting elements, and the dummy elements includes a reflector arranged, a first electrode arranged above the reflector, a light-emitting layer arranged above the first electrode, and a second electrode arranged above the light-emitting layer. A difference between a distance from the reflector to the light-emitting layer in the first light-emitting element and a distance from the reflector to the light-emitting layer in the second light-emitting element is larger than a difference between a distance from the reflector to the light-emitting layer in the first dummy element and a distance from the reflector to the light-emitting layer in the second dummy element.

23 Claims, 15 Drawing Sheets

(56) References Cited

U.S. PATENT DOCUMENTS

| | | |
|---|---|---|
| 2018/0205039 A1 | 7/2018 | Koshihara et al. |
| 2018/0213142 A1* | 7/2018 | Usui ................... H04N 5/23287 |
| 2019/0189969 A1* | 6/2019 | Youn ................... H01L 27/3223 |
| 2019/0198816 A1* | 6/2019 | Park .................... G02B 27/0176 |
| 2020/0066818 A1* | 2/2020 | Akagawa ............ H01L 51/5265 |
| 2020/0271987 A1* | 8/2020 | Park .................... G02F 1/13439 |
| 2021/0098300 A1* | 4/2021 | Kusunoki .......... H04N 5/23232 |
| 2021/0313361 A1* | 10/2021 | Ebiko ............... H01L 27/14623 |

* cited by examiner

F I G. 14A
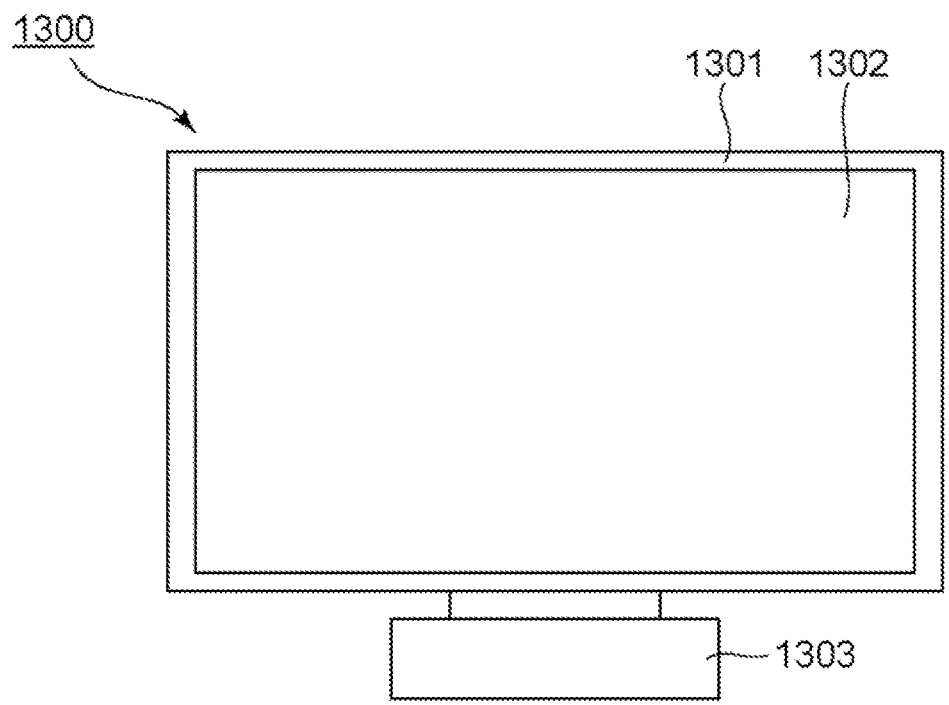
F I G. 14B
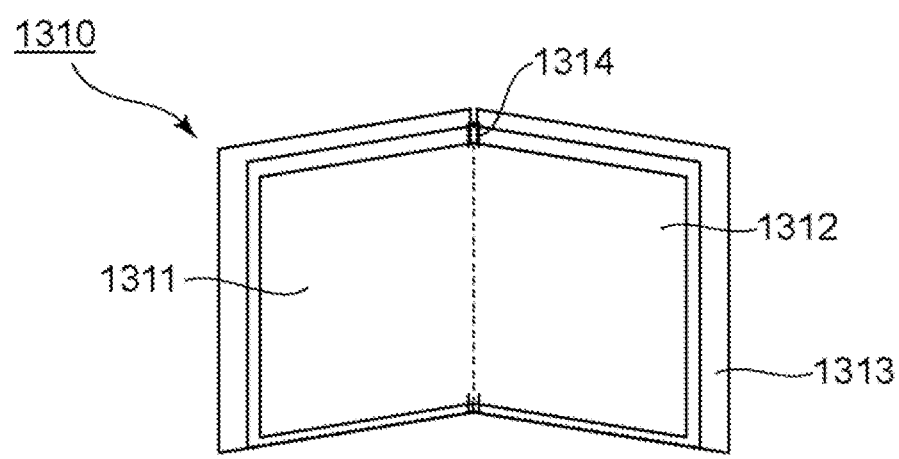

F I G. 15
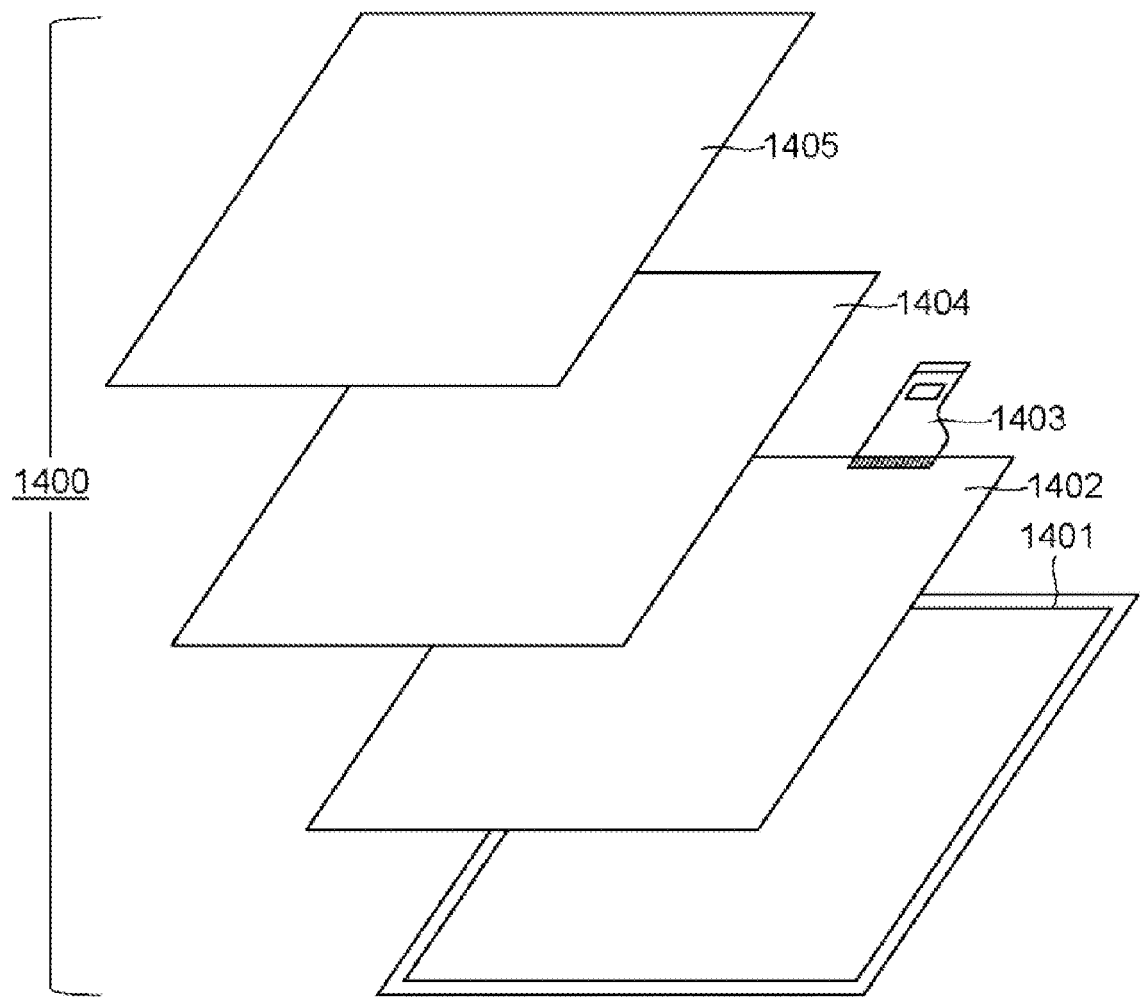

LIGHT-EMITTING DEVICE, DISPLAY DEVICE, PHOTOELECTRIC CONVERSION DEVICE, ELECTRONIC APPARATUS, ILLUMINATION DEVICE, AND MOBILE BODY

BACKGROUND OF THE INVENTION

Field of the Invention

The present invention relates to a light-emitting device, a display device, a photoelectric conversion device, an electronic apparatus, an illumination device, and a mobile body.

Description of the Related Art

A light-emitting device including an organic EL light-emitting element has been attracting attention. There is known a method (to be referred to as a white+CF method hereinafter) that uses a light-emitting element that emits white light and a color filter to increase the resolution of the light-emitting device. In the white+CF method, an organic layer is formed on the entire surface of the substrate. Therefore, compared to a method of forming an organic layer for each color using a metal mask, the white+CF method is relatively easy to achieve a high resolution for the pixel size, the pitch between pixels, or the like. Japanese Patent Laid-Open No. 2017-146374 describes a white+CF type electrooptical device in which a pixel electrode provided for each pixel is formed by a transparent conductive film, and a power supply line serving as a reflective layer is arranged between the pixel electrode and the substrate. By constructing the optical resonance structure between the reflective layer and the counter electrode, the light extraction efficiency and color reproducibility are improved. Further, Japanese Patent Laid-Open No. 2017-146374 describes that the electrooptical device includes a display region in which an image is displayed by driving pixels, and a peripheral region which is adjacent to the display region and in which dummy pixels each having a structure similar to that of the pixel but do not contribute to image display are arranged.

In the structure described in Japanese Patent Laid-Open No. 2017-146374, since the film thickness of the optical path adjustment layer between the reflective layer and the counter electrode that implements optical resonance is different for each color to be displayed, the counter electrode is formed on the uneven shape corresponding to the film thickness of the optical path adjustment layer. The unevenness corresponding to the film thickness of the optical path adjustment layer is formed not only in the display region but also in the peripheral region. If the uneven shape becomes large, a thin film portion can be generated in the counter electrode when the counter electrode is formed. If the thin film portion is generated in the counter electrode, the resistance of the counter electrode increases, and the resistance in the supply path of the power for driving the pixels in the display region increases, which may lead to a rise in driving voltage.

SUMMARY OF THE INVENTION

Each of some embodiments of the present invention provides a technique advantageous in suppressing a rise in driving voltage of a light-emitting device.

According to some embodiments, a light-emitting device comprising a display region for displaying an image, in which a first light-emitting element and a second light-emitting element are arranged, and a dummy region in which a first dummy element and a second dummy element are arranged and which does not display an image, wherein each of the first light-emitting element, the second light-emitting element, the first dummy element, and the second dummy element includes a reflective layer arranged on a substrate, a first electrode arranged above the reflective layer, a light-emitting layer arranged above the first electrode, and a second electrode arranged above the light-emitting layer, a distance from the reflective layer to the light-emitting layer in the first light-emitting element is different from a distance from the reflective layer to the light-emitting layer in the second light-emitting element, and where a difference between the distance from the reflective layer to the light-emitting layer in the first light-emitting element and the distance from the reflective layer to the light-emitting layer in the second light-emitting element is set as a first difference, and a difference between a distance from the reflective layer to the light-emitting layer in the first dummy element and a distance from the reflective layer to the light-emitting layer in the second dummy element is set as a second difference, the second difference is smaller than the first difference, is provided.

According to some other embodiments, a light-emitting device comprising a display region for displaying an image, in which a first light-emitting element and a second light-emitting element are arranged, and a dummy region in which a first dummy element and a second dummy element are arranged and which does not display an image, wherein each of the first light-emitting element, the second light-emitting element, the first dummy element, and the second dummy element includes a reflective layer arranged on a substrate, a first electrode arranged above the reflective layer, a light-emitting layer arranged above the first electrode, a second electrode arranged above the light-emitting layer, and an insulating layer arranged between the reflective layer and the first electrode, a film thickness of the insulating layer of the first light-emitting element is different from a film thickness of the insulating layer of the second light-emitting element, and where a difference between the film thickness of the insulating layer of first light-emitting element and the film thickness of the insulating layer of the second light-emitting element is set as a first difference, and a difference between a film thickness of the insulating layer of the first dummy element and a film thickness of the insulating layer of the second dummy element is set as a second difference, the second difference is smaller than the first difference, is provided.

Further features of the present invention will become apparent from the following description of exemplary embodiments with reference to the attached drawings.

BRIEF DESCRIPTION OF THE DRAWINGS

FIGS. 14A and 14B are views each showing an example of a display device using the light-emitting device shown in FIG. 1;

FIG. 15 is a view showing an example of an illumination device using the light-emitting device shown in FIG. 1.

DESCRIPTION OF THE EMBODIMENTS

Figure 1:
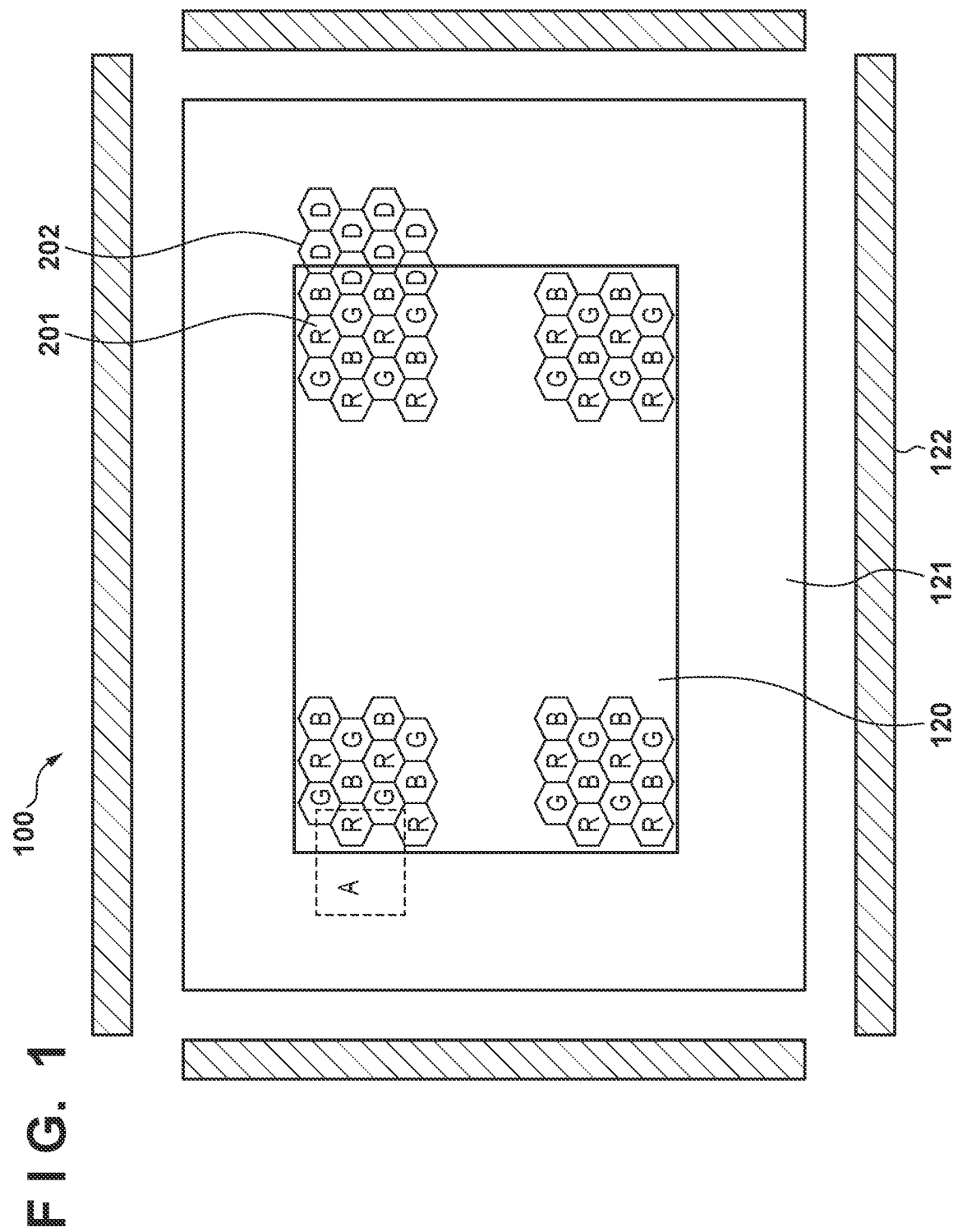
FIG. 1 is a plan view showing an arrangement example of a light-emitting device according to an embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

With reference to FIGS. 1 to 10, the structures of light-emitting devices according to an embodiment of the present invention will be described. FIG. 1 is a plan view showing an arrangement example of a light-emitting device 100 in this embodiment. The light-emitting device 100 includes a display region 120 for displaying an image, in which a plurality of light-emitting elements 201 are arranged, and a dummy region 121 in which a plurality of dummy elements 202 are arranged and which does not display an image. As shown in FIG. 1, the dummy region 121 may be arranged so as to surround the display region 120. The light-emitting elements 201 and the dummy elements 202 are arranged in a two-dimensional array. In the display region 120, an image is actually displayed by driving each light-emitting element 201. The dummy element 202 arranged in the dummy region 121 has a structure similar to that of the light-emitting element 201 arranged in the display region 120, but does not actually contribute to display of the image. The dummy element 202 may not emit light. The dummy element 202 is, for example, arranged to suppress light reflection outside the display region 120, and provided with a reflective electrode structure similar to that of the display region 120. The outer edge of the display region 120 may be defined by the outer edge of the outermost light-emitting element 201 among the plurality of light-emitting elements 201 that actually emit light. Alternatively, as shown in FIG. 1, the outer edge of the display region 120 may be a substantially rectangular shape obtained by connecting the outer edges of the outermost light-emitting elements 201 among the plurality of light-emitting elements 201 that actually emit light.

Figure 2:
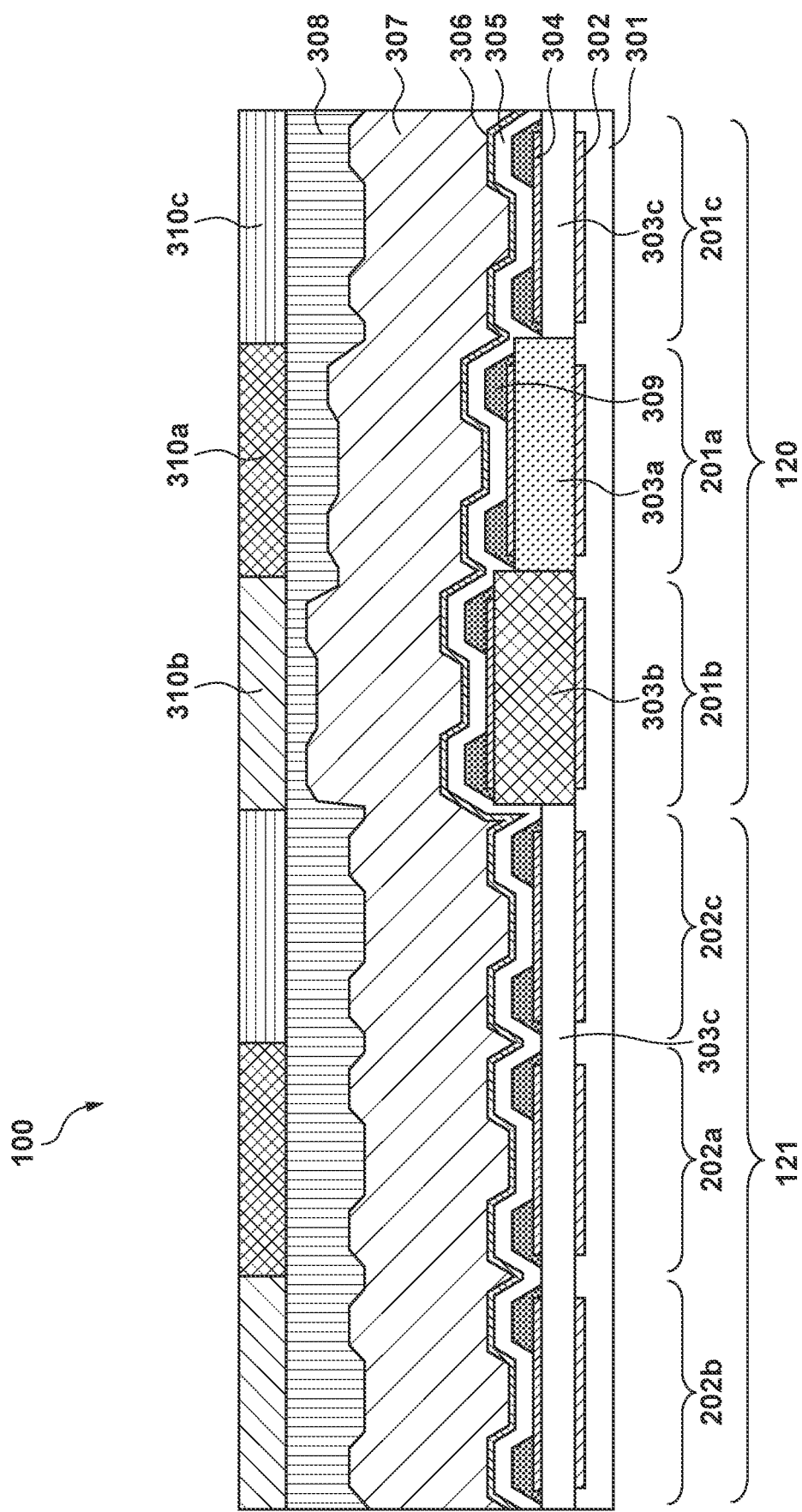
FIG. 2 is a sectional view of the light-emitting device shown in FIG. 1.

FIG. 2 is a schematic sectional view of a boundary portion A between the display region 120 and the dummy region 121 shown in FIG. 1. The light-emitting element 201 is arranged on a substrate 301 in the display region 120, and the dummy element 202 is arranged on the substrate 301 in the dummy region 121. Each of the light-emitting element 201 and the dummy element 202 includes a reflective layer 302 arranged on the substrate 301, an electrode 304 arranged above the reflective layer 302, an organic layer 305 including a light-emitting layer arranged on the electrode 304, and an electrode 306 arranged on the organic layer 305. In addition, an insulating layer 303 is arranged between the reflective layer 302 and the electrode 304 (also referred to as a lower electrode or an individual electrode) arranged for each of the light-emitting element 201 and the dummy element 202. Further, a sealing layer 307 and a planarizing layer 308 are arranged on the electrode 306 (also referred to as an upper electrode or a common electrode) shared by the light-emitting element 201 and the dummy element 202. In the arrangement shown in FIG. 2, the sealing layer 307 and the planarizing layer 308 are shown as different layers, but they may be formed as one layer. Further, in the arrangement shown in FIG. 2, each light-emitting element 201 includes one of color filters 310 (310a, 310b, and 310c) that transmit different colors. This enables the light-emitting device 100 to perform, for example, full-color display. The color filter 310 can be arranged in the dummy region 121.

The insulating layers 303a to 303c arranged in the light-emitting elements 201a to 201c, respectively, have different thicknesses to optimize the optical distance from the upper surface of the reflective layer 302 to the light-emitting position of the light-emitting layer of the organic layer 305 in accordance with the colors transmitted by the color filters 310a to 310c. It can be said that the plurality of light-emitting elements 201a to 201c include the light-emitting elements whose insulating layers 303 have different film thicknesses. The insulating layer 303 optimizes the optical distance from the reflective layer 302 to the light-emitting layer of the organic layer 305, so that it can be also referred to as an optical path adjustment layer. On the other hand, the insulating layer 303 arranged in the dummy element 202 does not change in accordance with the color filters 310a to 310c arranged in the dummy elements 202, and the distance from the reflective layer 302 to the light-emitting layer of the organic layer 305 is constant. In other words, the distance from the reflective layer 302 to the light-emitting layer of the organic layer 305 in the dummy element 202a is equal to the distance from the reflective layer 302 to the light-emitting layer of the organic layer 305 in the dummy element 202b. Similarly, the distance from the reflective layer 302 to the light-emitting layer of the organic layer 305 in the dummy element 202a is equal to the distance from the reflective layer 302 to the light-emitting layer of the organic layer 305 in the dummy element 202c. In the arrangement shown in FIG. 2, the insulating layer 303 arranged in the dummy element 202 has the film thickness similar to that of the insulating layer 303c arranged in the light-emitting element 201c.

In this embodiment, the difference between the distance from the reflective layer 302 to the light-emitting layer of the organic layer 305 in the light-emitting element 201a and the distance from the reflective layer 302 to the light-emitting layer of the organic layer 305 in the light-emitting element 201b is set as the first difference. In addition, the difference between the distance from the reflective layer 302 to the light-emitting layer of the organic layer 305 in the dummy element 202a and the distance from the reflective layer 302 to the light-emitting layer of the organic layer 305 in the dummy element 202b or 202c is set as the second difference. In this case, the second difference is smaller than the first difference. Similarly, even if the difference between the distance from the reflective layer 302 to the light-emitting layer of the organic layer 305 in the light-emitting element 201*b* and the difference in the light-emitting element 201*c* is set as the first difference, the second difference is smaller than the first difference. Further, even if the difference between the distance from the reflective layer 302 to the light-emitting layer of the organic layer 305 in the light-emitting element 201*a* and the difference in the light-emitting element 201*c* is set as the first difference, the second difference is smaller than the first difference. In the arrangement shown in FIG. 2, the difference in distance from the reflective layer 302 to the light-emitting layer of the organic layer 305 between any two of the plurality of dummy elements 202*a* to 202*c* is smaller than the difference between the distance from the reflective layer 302 to the light-emitting layer of the organic layer 305 in the light-emitting element 201*b* having the largest distance among the plurality of light-emitting elements 201*a* to 201*c*, and the distance in the light-emitting element 201*c* having the smallest distance among them. Here, the difference in distance from the reflective layer 302 to the light-emitting layer of the organic layer 305 can be the difference in film thickness of the insulating layer 303 arranged in each of the light-emitting elements 201*a* to 201*c* and the dummy elements 202*a* to 202*c*. The details will be described layer.

A material, that can support the light-emitting elements 201 and the dummy elements 202 each including the reflective layer 302, the insulating layer 303, the electrode 304, the organic layer 305, and the electrode 306, and the like, is used for the substrate 301. As the material of the substrate 301, glass, a plastic, silicon, or the like can be used. In addition, a switching element such as a transistor, wirings, or the like may be formed in the substrate 301 below the reflective layer 302 (on the side opposite to the organic layer 305) via an interlayer insulating film or the like.

From the viewpoint of luminous efficiency, a metal material having a visible light reflectance equal to or larger than 50% may be used for the reflective layer 302. More specifically, a metal such as aluminum (Al) or silver (Ag), an allow obtained by adding silicon (Si), copper (Cu), nickel (Ni), neodymium (Nd), titanium (Ti), or the like to the metal can be used for the reflective layer 302. The reflective layer 302 may have a stacked structure including, in addition to the layer formed of the above-described material, a barrier layer on the light-reflecting surface. As a material of the barrier layer, a metal such as Ti, tungsten (W), molybdenum (Mo), gold (Au) or an alloy thereof, or a transparent conductive oxide such as indium tin oxide (ITO) or indium zinc oxide (IZO) may be used.

An inorganic material such as silicon nitride (SiN), silicon oxynitride (SiON), or silicon oxide (SiO) can be used for the insulating layer 303. The insulating layer 303 can be formed using a known technique such as a sputtering method or a chemical vapor deposition method (CVD method). The insulating layer 303 can also be formed using an organic material such as an acrylic resin or a polyimide resin. Further, the insulating layer 303 may have a stacked structure formed by a plurality of layers. In this embodiment, an example in which the insulating layers 303 have three types of film thicknesses is shown, but the present invention is not limited thereto.

The film thicknesses of the insulating layers 303*a* to 303*c* for optimizing the distance (optical distance) between the reflective layer 302 and the light-emitting layer of the organic layer 305 in each of the light-emitting elements 201*a* to 201*c* for the respective colors transmitted by the color filters 310*a* to 310*c* will be described. When Lr represents the optical path length from the upper surface of the reflective layer 302 to the light-emitting layer of the organic layer 305, and Φr represents the phase shift in the reflective layer 302:

$$Lr=\{2m-(\Phi r/\pi)\}\times(\lambda/4) \quad (1)$$

where m is an integer (non-negative integer) equal to or larger than 0. The optical distances of the insulating layers 303*a* to 303*c* are optimized for respective colors so as to approximately satisfy equation (1).

Further, when Φs represents the phase shift on the reflecting surface of the electrode 306 upon reflecting light having a wavelength λ, an optical distance Ls from the light-emitting layer of the organic layer 305 to the reflecting surface of the electrode 306 approximately satisfies following equation (2). In this arrangement, m'=0.

$$Ls=\{2m'-(\Phi s/\pi)\}\times(\lambda/4)=-(\Phi s/\pi)\times(\lambda/4) \quad (2)$$

Therefore, a total layer interference L approximately satisfies following equation (3):

$$L=Lr+Ls=(2m-\Phi/\pi)\times(\lambda/4) \quad (3)$$

where Φ is the sum Φr+Φs of the phase shifts upon reflecting the light having the wavelength λ by the reflective layer 302 and the electrode 306.

The electrode 304 can be a transparent conductive film that transmits visible light, and ITO, IZO, aluminum zinc oxide (AZO), indium gallium zinc oxide (IGZO), or the like is used. As shown in FIG. 2, a partition 309 may be provided in the outer peripheral portion of the electrode 304 in each of the light-emitting element 201 and the dummy element 202. The partition 309 is provided so as to cover the end portion of the outer edge of the electrode 304, and an opening is provided so that a part of the center of the electrode 304 is exposed. An inorganic material such as SiN, SiON, or SiO may be used for the partition 309. The partition 309 may be formed using a known technique such as a sputtering method or a CVD method. Further, an organic material such as an acrylic resin or a polyimide resin may be used for the partition 309.

The organic layer 305 is arranged on the electrode 304, and can be formed using a known technique such as a vapor deposition method or a spin coating method. The organic layer 305 may be formed by a plurality of layers including the light-emitting layer. Examples of the plurality of layers include a hole injection layer, a hole transport layer, an electron block layer, the light-emitting layer, a hole block layer, an electron transport layer, and an electron injection layer. The organic layer 305 emits light when holes injected from the anode and electrons injected from the cathode are recombined in the light-emitting layer. The light-emitting layer may be formed by a single layer or a plurality of layers. Each light-emitting layer can include a red light-emitting material, a green light-emitting material, or a blue light-emitting material, and it is also possible to obtain white light by mixing the respective emitted colors. Further, each light-emitting layer may include light-emitting materials having a complementary color relationship such as a blue light-emitting material and a yellow light-emitting material. In addition, as shown in FIG. 2, the organic layer 305 may be shared by the plurality of light-emitting elements 201 and the plurality of dummy elements 202. However, the present invention is not limited to this, and all or part of the organic layer 305 may be patterned for each or some light-emitting elements 201 or for each or some dummy elements 202.

The electrode 306 is arranged on the organic layer 305, and has translucency. The electrode 306 may be a semi-transmissive material having a property (that is, semi-transmissive reflectivity) of transmitting part of the light reaching its surface and reflecting the other part of the light. For the electrode 306, for example, a transparent material such as a transparent conductive oxide, or a semi-transmissive material such as a metal such as Al, Ag, or Au, an alkali metal such as lithium (Li) or cesium (Cs), an alkali earth metal such as magnesium (Mg), calcium (Ca), or barium (Ba), or an alloy material containing these metal materials. For example, the semi-transmissive material used for the electrode 306 may be an alloy containing Mg or Ag as a main component. The electrode 306 may have a stacked structure of the above-described materials. The electrode 306 can have any structure as long as it has a suitable transmittance and conductivity. The electrode 306 is shared over the light-emitting elements 201 and the dummy elements 202 as shown in FIG. 2. In this embodiment, the electrode 304 is the anode and the electrode 306 is the cathode, but the electrode 304 may be the cathode and the electrode 306 may be the anode.

The sealing layer 307 is formed so as to cover the organic layer 305 including the light-emitting layer. The sealing layer 307 may include an inorganic material having translucency and low permeability of oxygen and moisture from the outside. For the sealing layer 307, for example, an inorganic material such as SiN, SiON, SiO, aluminum oxide ($Al_2O_3$), or titanium oxide ($TiO_2$) can be used. From the viewpoint of sealing performance, SiN, SiON, or $Al_2O_3$ may be used. A CVD method, an atomic layer deposition method (ALD method), a sputtering method, or the like can be used to form the sealing layer 307. As long as sufficient moisture blocking performance is provided, the sealing layer 307 may have a single-layer structure, or a stacked structure obtained by combining the above-described materials or forming methods. In this embodiment, the sealing layer 307 is arranged over the plurality of light-emitting elements 201 and the plurality of dummy elements 202.

The planarizing layer 308 is formed on the sealing layer 307. The planarizing layer 308 may be formed of an inorganic material or an organic material as long as the material has translucency. For example, the sealing layer 307 may be formed by applying an organic material.

The color filter 310 is arranged on the planarizing layer 308. In this embodiment, the color filters 310a, 310b, and 310c are color filters that transmit different colors. Thus, in the light-emitting device 100, it is possible to regard each of the light-emitting elements 201a, 201b, and 201c as a sub pixel, and regard the three sub pixels as one main pixel. The color filters 310a, 310b, and 310c may be color filters that transmit red, green, and blue light, respectively. The additive color mixture of these sub pixels enables the light-emitting device 100 to perform full-color display. In this embodiment, an example of the color filters that transmit light components of three colors is shown, but the present invention is not limited to this. The planar array of the light-emitting elements 201a, 201b, and 201c may be any of a stripe array, a square array, a delta array, a pentile array, and a Bayer array. By arranging the main pixels in a matrix, an organic EL display device having a large number of pixels can be implemented.

Figure 10:
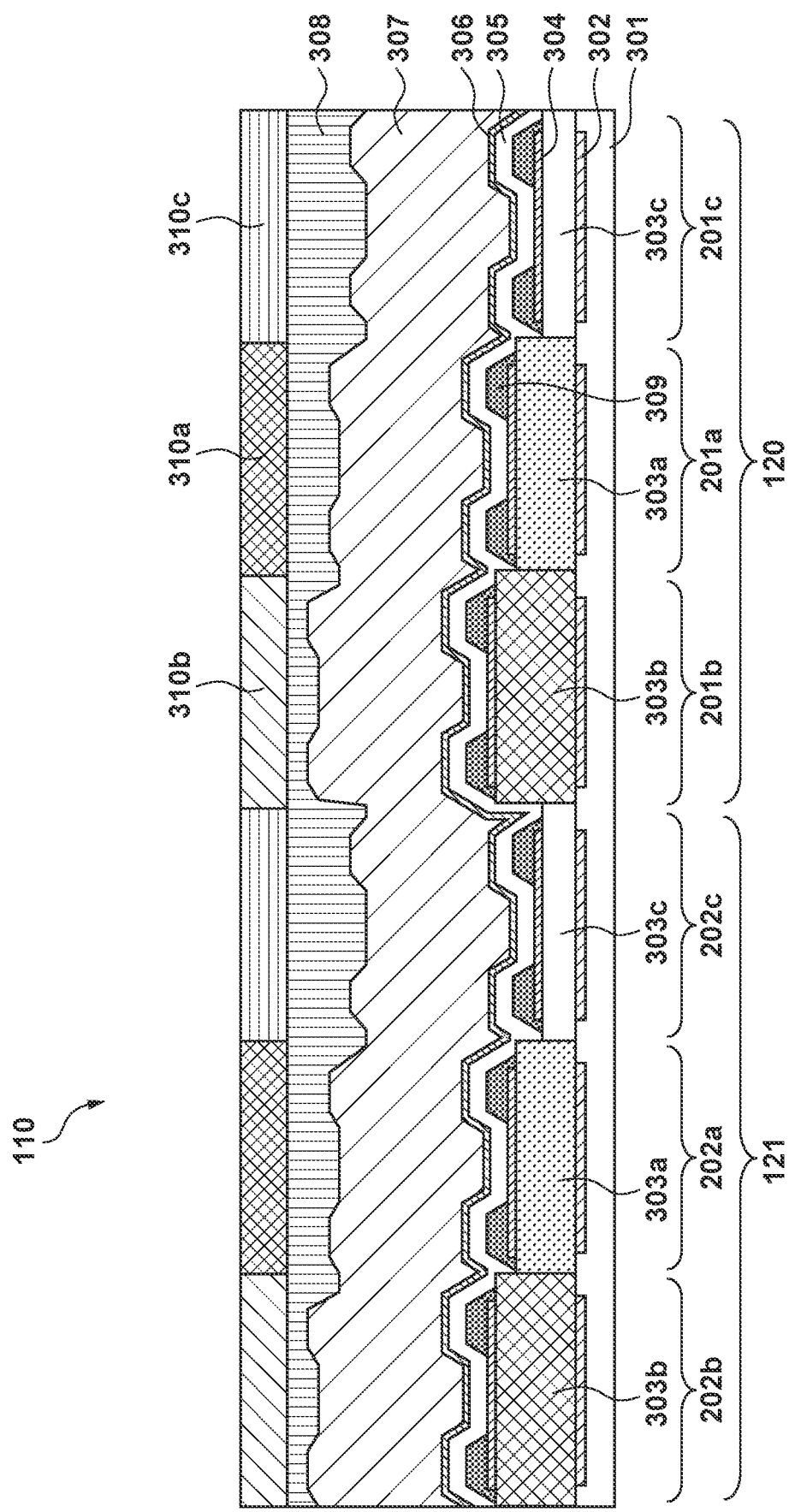
FIG. 10 is a sectional view of a light-emitting device of a comparative example.

Next, the effect obtained by the arrangement of the light-emitting device 100 of this embodiment as described above will be described. FIG. 10 shows a sectional view of a light-emitting device 110 in a comparative example. In the light-emitting device 110, as in the light-emitting elements 201a to 201c in the display region 120, the dummy elements 202a to 202c include insulating layers 303a to 303c, respectively, having different film thicknesses. That is, the film thickness of the insulating layer 303 is different among the dummy elements 202a to 202c (sub pixels), so that steps are formed on the upper surface of the organic layer 305. Further, the electrode 306 is formed on the upper surface of the organic layer 305 over the entire area of the display region 120 and the dummy region 121. Therefore, the unevenness of the electrode 306 becomes large in accordance with the difference in film thickness among the insulating layers 303a to 303c for the respective sub pixels.

Here, as shown in FIG. 1, the light-emitting device 100 includes a contact region 122 for supplying a potential to the electrode 306 such that the dummy region 121 is arranged between the contact region 122 and the display region 120. The contact region 122 connects the electrode 306 to the cathode potential from outside the dummy region 121. The contact regions 122 may be arranged so as to surround the display region 120 and the dummy region 121 as shown in FIG. 1. The electric current, which flows between the electrode 304 and the electrode 306 to cause the light-emitting layer of the organic layer 305 to emit light, passes through the electrode 306 arranged on the light-emitting elements 201 and the dummy elements 202 and flows into the contact region 122. At this time, as shown in FIG. 10, if the steps of the electrode 306 in the dummy region 121 become large, a thin film portion can be generated in the electrode 306 when the electrode 306 is formed. If the thin film portion is generated in the electrode 306, the resistance of the electrode 306 increases, and the resistance in the supply path of the power for driving the light-emitting elements 201 in the display region 120 increases, which may lead to a rise in driving voltage.

On the other hand, in this embodiment, the insulating layer 303 (303c) arranged on the reflective layers 302 in the dummy elements 202a to 202c has a constant film thickness regardless of the dummy elements 202a to 202c. Accordingly, there is no difference in film thickness of the insulating layer 303 among the dummy elements 202a to 202c (sub pixels). This can decrease the unevenness of the electrode 306 arranged on the dummy region 121. Therefore, it is possible to suppress generation of the thin film portion in the electrode 306 formed in the dummy region 121 when the electrode 306 is formed. As a result, a rise in resistance of the electrode 306 in the dummy region 121 is suppressed, and a rise in driving voltage of the light-emitting device 100 is suppressed.

In the arrangement shown in FIG. 2, the thickness of the insulating layer 303 arranged in the dummy region 121 is set to be equal to the thickness of the insulating layer 303c arranged in the light-emitting element 201c, but the present invention is not limited to this. For example, the thickness of the insulating layer 303 arranged in the dummy region 121 may be equal to the film thickness of the insulating layer 303a or the insulating layer 303b. As long as the insulating layer 303 arranged in the dummy element 202 has the film thickness equal to the film thickness of any of the insulating layers 303a to 303c arranged in the light-emitting elements 201, it is possible to decrease the step of the electrode 306 in the dummy region 121 without increasing the number of processing steps. Alternatively, the thickness of the insulating layer 303 arranged in the dummy region 121 may be different from the film thicknesses of the insulating layers 303a to 303c.

Figure 3:
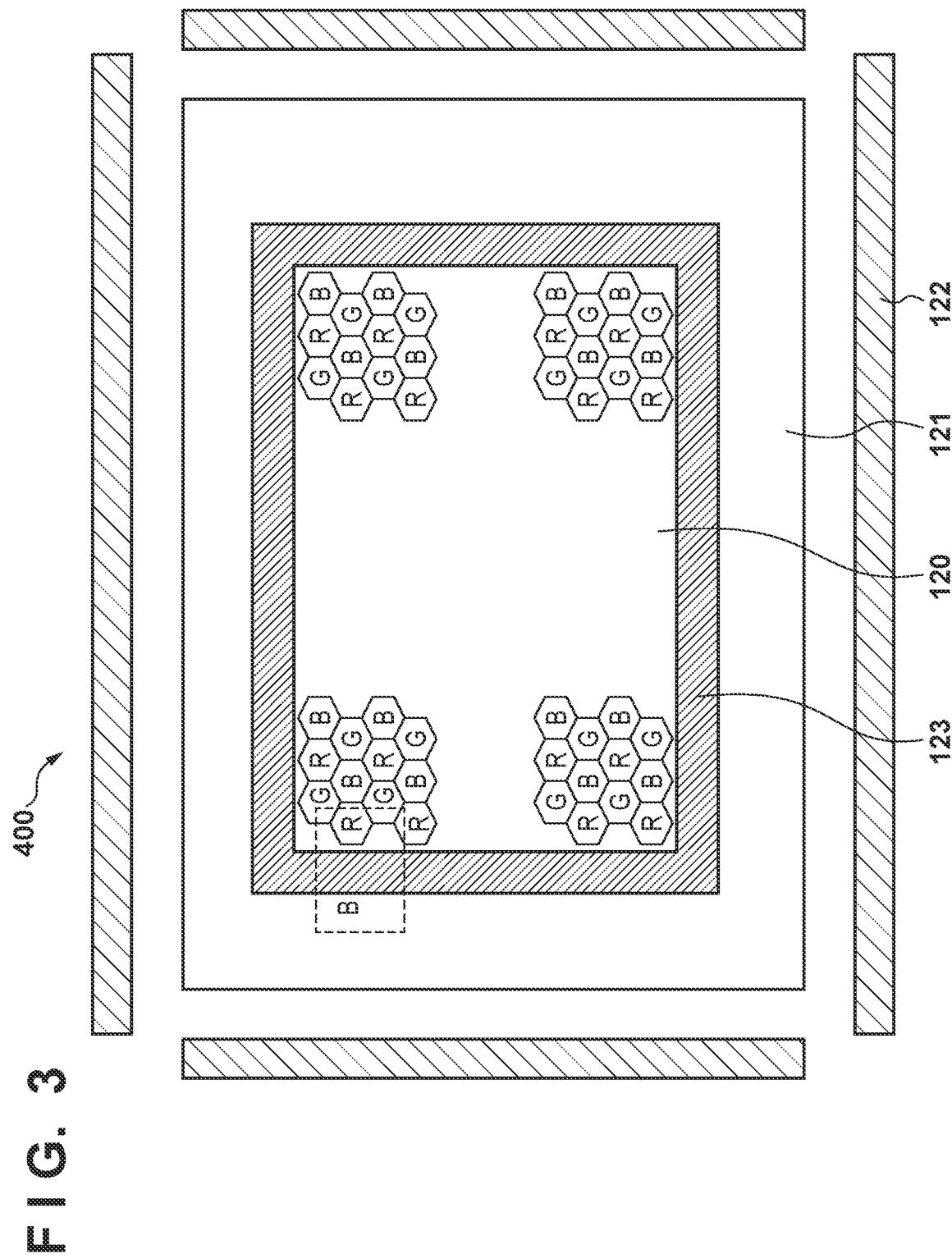
FIG. 3 is a plan view showing a modification of the light-emitting device shown in FIG. 1.

Next, with reference to FIGS. 3 and 4, a modification of the above-described light-emitting device 100 will be described. FIG. 3 is a plan view showing an arrangement example of a light-emitting device 400 of this embodiment.

Figure 4:
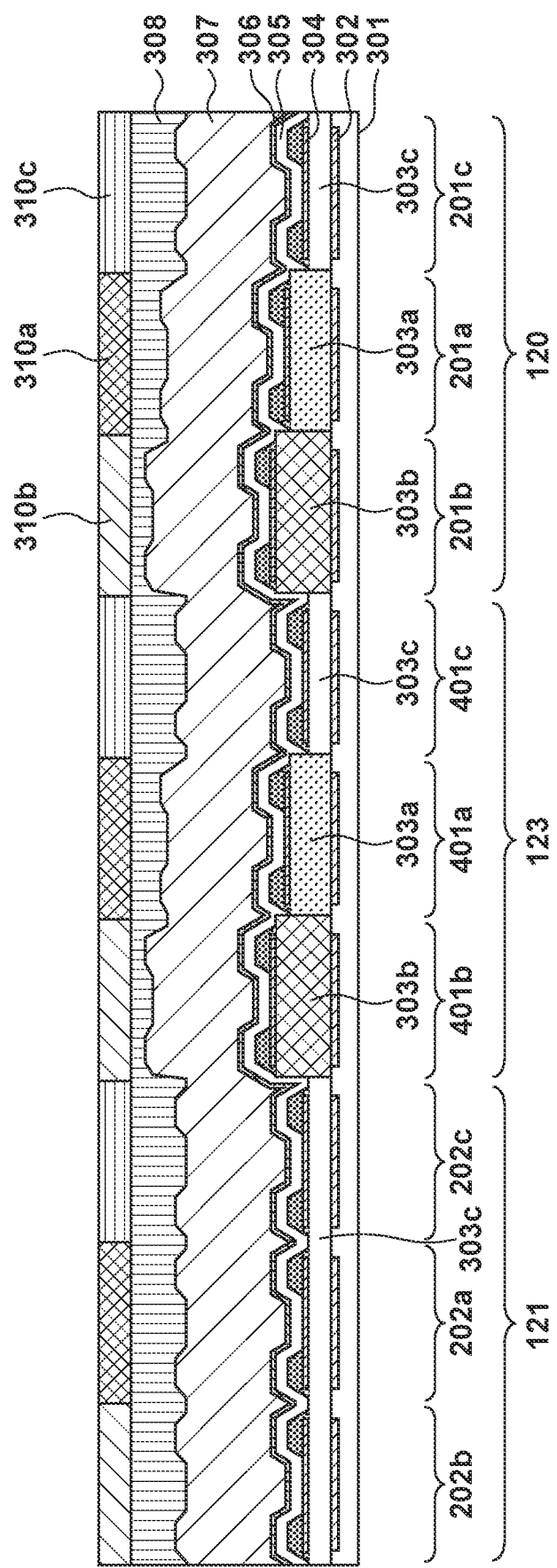
FIG. 4 is a sectional view of the light-emitting device shown in FIG. 3.

FIG. 4 is a schematic sectional view of a boundary portion B between the display region 120 and the dummy region 121 shown in FIG. 3. Compared to the above-described light-emitting device 100, the light-emitting device 400 further includes, between the display region 120 and the dummy region 121, an intermediate region 123 in which a plurality of intermediate dummy elements 401 are arranged and which does not display an image. The intermediate dummy element 401 arranged in the intermediate region 123 may not emit light.

As in the light-emitting device 100 described above, the dummy region 121 is a region in which the film thickness of the insulating layer 303 is the same among the dummy elements 202a to 202c so there is no difference in film thickness between the reflective layer 302 and the electrode 304 among the dummy elements 202. On the other hand, the plurality of intermediate dummy elements 401 include intermediate dummy elements 401a to 401c that have different distances between the reflective layers 302 and the light-emitting layer of the organic layer 305. Further, the difference between the distance from the reflective layer 302 to the light-emitting layer of the organic layer 305 in the light-emitting element 201a and the distance from the reflective layer 302 to the light-emitting layer of the organic layer 305 in the light-emitting element 201b is set as the first difference. In addition, the difference between the distance from the reflective layer 302 to the light-emitting layer of the organic layer 305 in the intermediate dummy element 401a and the distance from the reflective layer 302 to the light-emitting layer of the organic layer 305 in the intermediate dummy element 401b is set as the third difference. In this case, the first difference is equal to the third difference. Similarly, even when if difference in distance from the reflective layer 302 to the light-emitting layer of the organic layer 305 between the light-emitting elements 201b and 201c is set as the first difference and the difference in distance from the reflective layer 302 to the light-emitting layer of the organic layer 305 between the intermediate dummy elements 401b and 401c is set as the third difference, the first difference is equal to the third difference. Furthermore, even when if difference in distance from the reflective layer 302 to the light-emitting layer of the organic layer 305 between the light-emitting elements 201a and 201c is set as the first difference and the difference in distance from the reflective layer 302 to the light-emitting layer of the organic layer 305 between the intermediate dummy elements 401a and 401c is set as the third difference, the first difference is similarly equal to the third difference. For example, the difference in distance from the reflective layer 302 to the light-emitting layer of the organic layer 305 between the light-emitting element having the largest distance among the plurality of light-emitting elements 201a to 201c and the light-emitting element having the smallest distance among them may be equal to the difference in distance from the reflective layer 302 to the light-emitting layer of the organic layer 305 between the intermediate dummy element having the largest distance among the plurality of intermediate dummy elements 401a to 401c and the intermediate dummy element having the smallest distance among them.

In this case, the relationship regarding the arrangement order of the light-emitting elements 201a to 201c in the display region 120 and the distances from the reflective layers 302 to the light-emitting layer of the organic layer 305 of the light-emitting elements 201a to 201c is similar to the relationship regarding the arrangement order of the intermediate dummy elements 401a to 401c in the intermediate region 123 and the distances from the reflective layers 302 to the light-emitting layer of the organic layer 305 of the intermediate dummy elements 401a to 401c. That is, the intermediate dummy elements 401a to 401c in the intermediate region 123 have the arrangement similar to that of the light-emitting elements 201a to 201c in the display region 120, and are arranged in a predetermined similar order. This makes it possible to stabilize the shape of the outermost periphery of the display region 120 upon manufacturing the light-emitting device 400, and suppress a rise in driving voltage while maintaining the quality of the displayed image. The number of the intermediate dummy elements 401 arranged in the intermediate region 123 may be about two, but may be larger than two. However, if a large number of intermediate dummy elements 401 are arranged, the unevenness of the electrode 306 becomes large, and this may lead to an increase in resistance in the intermediate region 123. Therefore, the number of the intermediate dummy elements 401 arranged between the light-emitting element which is arranged at the outer edge of the display region 120 among the plurality of light-emitting elements 201 and the dummy element which is closest to the light-emitting element among the plurality of dummy elements 202 may be, for example, between two (inclusive) and ten (inclusive).

Figure 5:
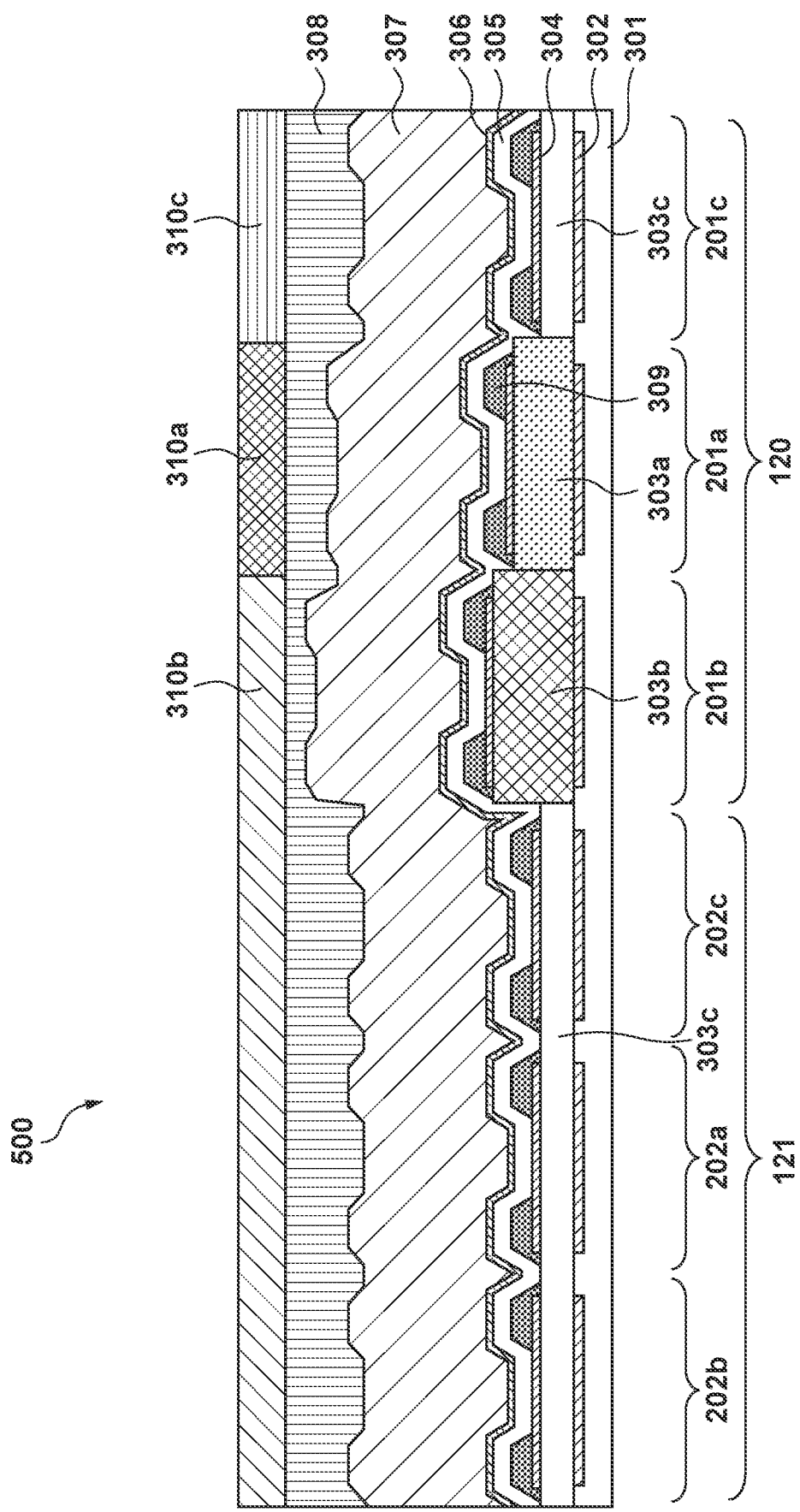
FIG. 5 is a sectional view showing another modification of the light-emitting device shown in FIG. 2.

FIG. 5 is a sectional view showing an arrangement example of a light-emitting device 500 of this embodiment showing another modification of the light-emitting device 100 described above. In the light-emitting device 100, the color filters 310a to 310c are arranged that transmit different colors by the respective dummy elements 202. On the other hand, in the light-emitting device 500 shown in FIG. 5, the common same color filter (color filter 310b) is arranged as the color filter 310 arranged in the dummy elements 202. In this case, the color filter 310 that transmits light having a wavelength different from the wavelength of light which resonates between the reflective layer 302 and the electrode 306 may be arranged in the plurality of dummy elements 202.

For example, assume that the insulating layer 303c is formed with a film thickness that makes the optical distance from the reflective layer 302 to the light-emitting layer of the organic layer 305 optimal for blue. In this case, the color filter 310b may be a color filter that transmits red. In this manner, the light which resonates between the reflective layer 302 and the light-emitting layer of the organic layer 305 and the light which is transmitted by the color filter arranged in the dummy element may have a complementary color relationship. With this arrangement, even when the electrode 304 of the dummy element 202 and the electrode 304 of the light-emitting element 201 adjacent to the dummy element 202 are short-circuited and the dummy element 202 emits light, the light suitable for the blue color filter is emitted from the organic layer 305. However, since the red color filter 310b is arranged on the dummy element 202, unnecessary light emitted by the dummy element 202 is suppressed and further blocked. In addition, for example, the peak wavelength of the light which resonates between the reflective layer 302 and the light-emitting layer of the organic layer 305 may be different from the peak wavelength of the light which is transmitted by the color filter 310 arranged on the dummy element 202 by 100 nm or more. In this case as well, it is possible to suppress the influence of light emission by the dummy element 202.

Figure 6:
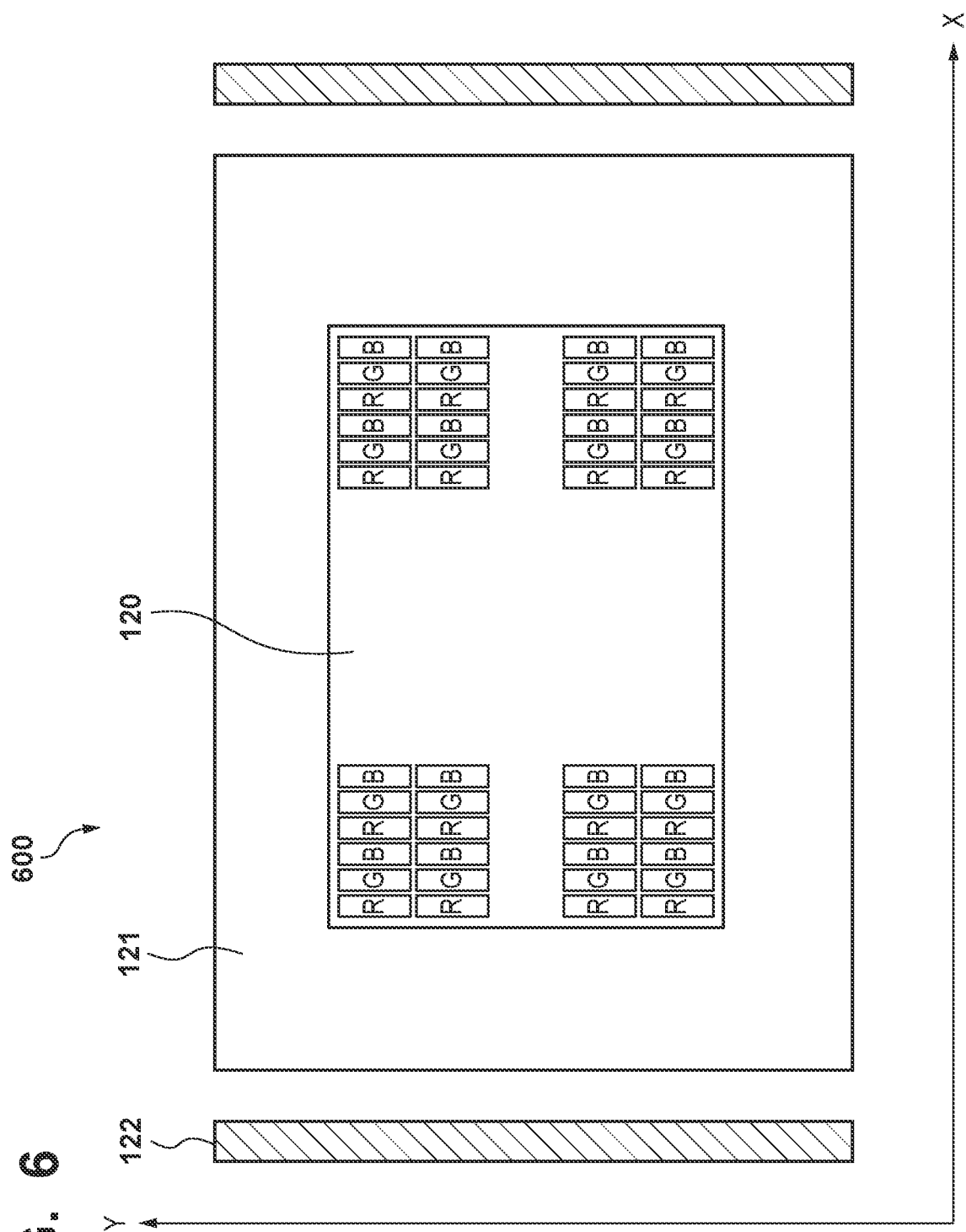
FIG. 6 is a plan view showing still another modification of the light-emitting device shown in FIG. 1.
Figure 7:
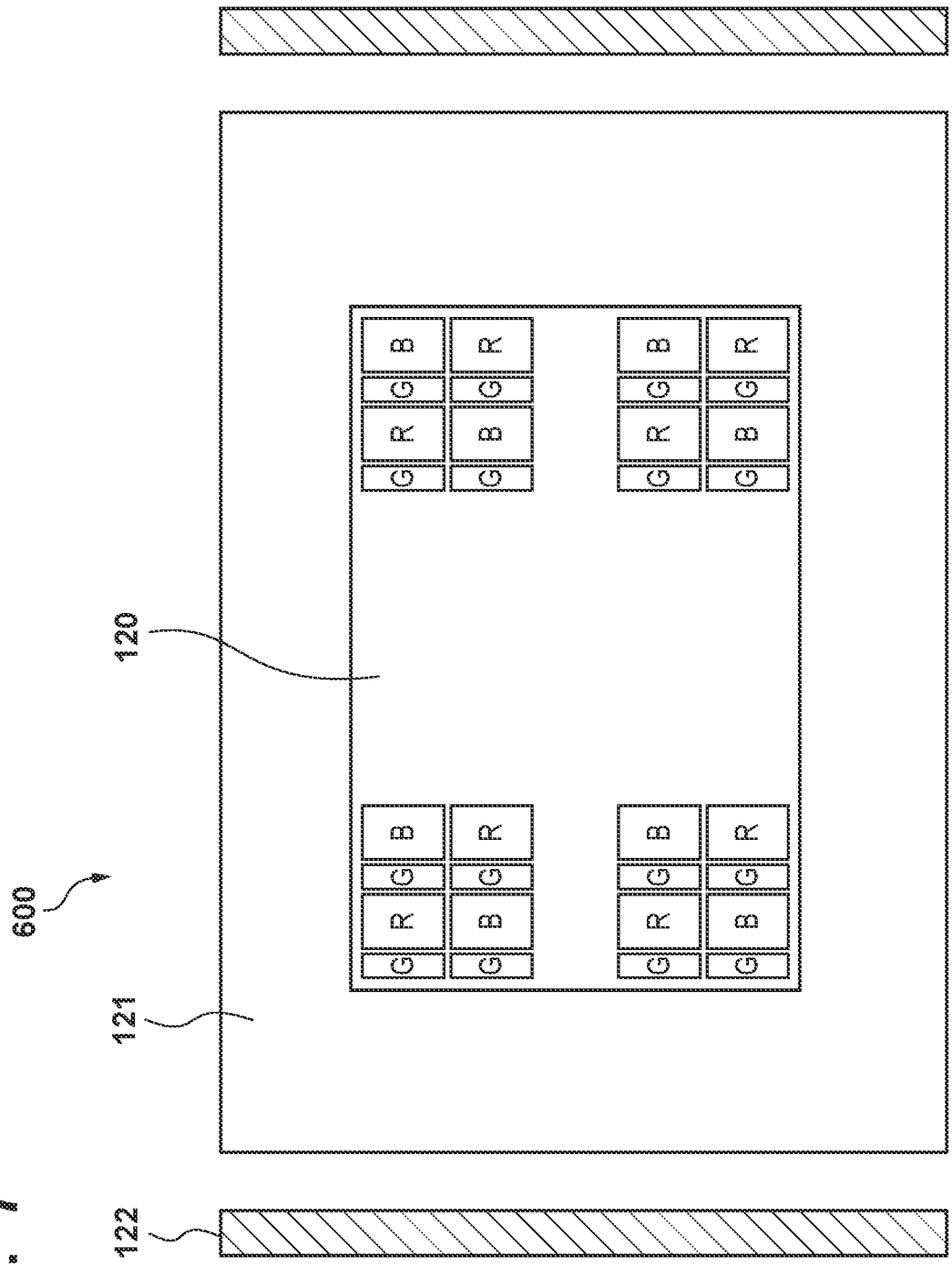
FIG. 7 is a plan view showing still another modification of the light-emitting device shown in FIG. 1.
Figure 8:
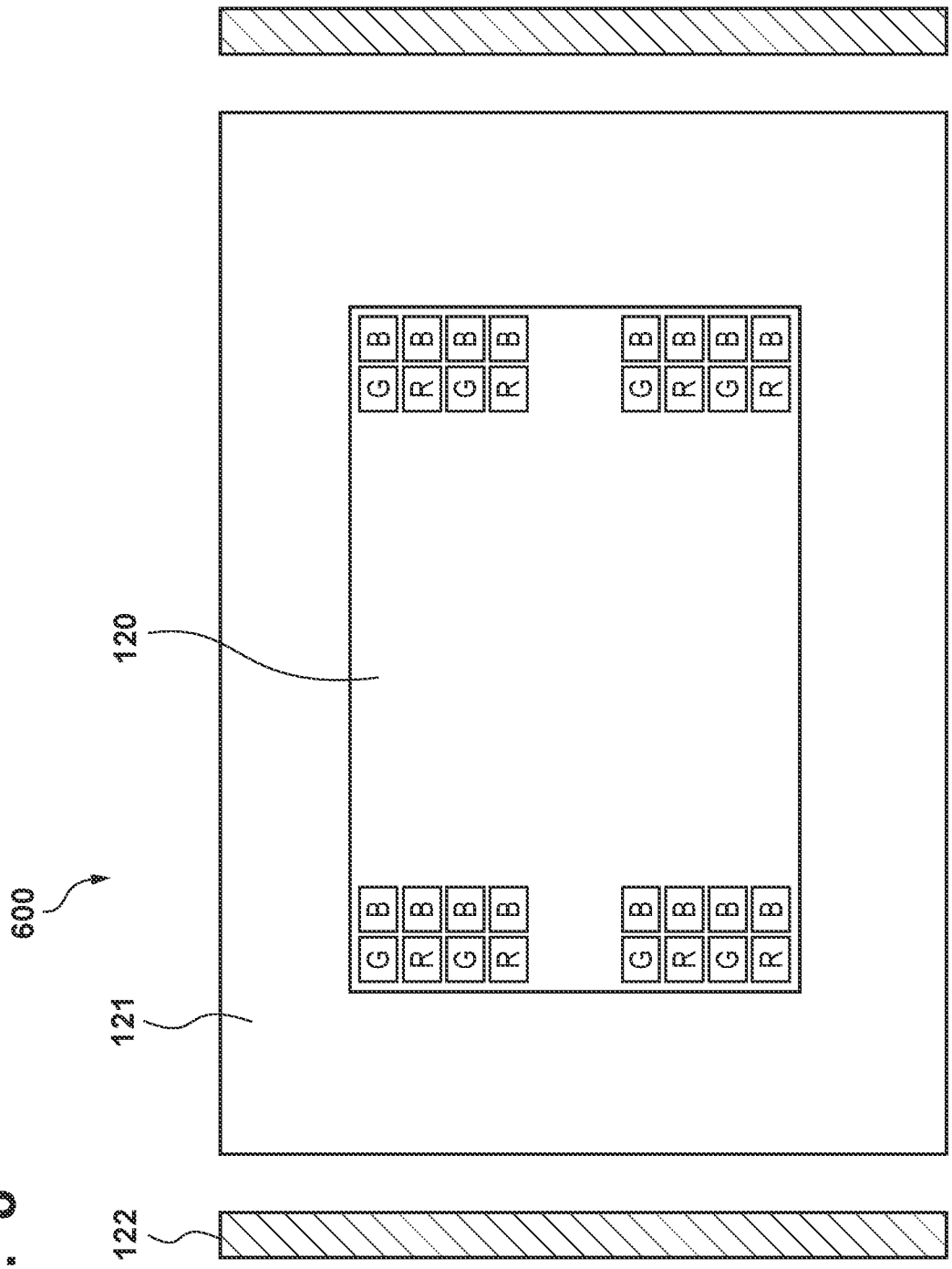
FIG. 8 is a plan view showing still another modification of the light-emitting device shown in FIG. 1.

With reference to FIGS. 6 to 8, further modifications of the above-described light-emitting device 100 will be described. FIG. 6 is a plan view showing an arrangement example of a light-emitting device 600 of this embodiment. In the light-emitting device 600, the contact regions 122 each for supplying a potential to the electrode 306 do not surround the display region 120 and the dummy region 121, but are arranged at both X-direction ends in the arrangement shown in FIG. 6.

FIG. 6 shows the light-emitting device 600 including the display region 120 in which the light-emitting elements 201 are arranged in a stripe array. As described above, the plurality of light-emitting elements 201 include a plurality of the light-emitting elements 201a (denoted by "G" in FIG. 6) each provided with, for example, the insulating layer 303a having the first distance from the reflective layer 302 to the light-emitting layer of the organic layer 305, and a plurality of the light-emitting elements 201b (denoted by "R" in FIG. 6) each provided with, for example, the insulating layer 303b having the second distance different from the first distance. In the X direction, any one of the plurality of the light-emitting elements 201b (R) is arranged between the light-emitting elements 201a (G) adjacent to each other among the plurality of the light-emitting elements 201a (G). In addition, in the Y direction intersecting the X direction, at least either of the plurality of the light-emitting elements 201a (G) and the plurality of the light-emitting elements 201b (R) are continuously arranged. In the stripe array shown in FIG. 6, both the plurality of the light-emitting elements 201a (G) and the plurality of the light-emitting elements 201b (R) are continuously arranged. In this case, the contact region 122 is arranged along the Y direction outside the outer edge of the dummy region 121 intersecting the X direction.

In the arrangement shown in FIG. 6, an electric current which flows from the electrode 304 to the electrode 306 to cause the light-emitting element 201 to emit light flows into the contact region 122 mainly along the X direction. At this time, in the light-emitting device 110 of the comparative example shown in FIG. 10, an unevenness is generated in the X direction due to the change in film thickness of the insulating layer 303, and the unevenness in shape of the electrode 306 is larger in the X direction than in the Y direction. Therefore, in the dummy region 121, the resistance of the electrode 306 can be larger in the X direction than in the Y direction. On the other hand, in the light-emitting device 600, the film thickness of the insulating layer 303 is constant over the dummy elements 202 arranged in the dummy region 121. Accordingly, in the dummy region 121, the difference in resistance between the X and Y directions is more suppressed than in the light-emitting device 110 of the comparative example. Thus, it is possible to suppress a rise in voltage for driving the light-emitting elements 201. In this manner, when the light-emitting elements 201 and the dummy elements 202 provided with the color filters 310 for different colors are arranged in the direction in which the electric current flows, the effect of the structure of the dummy region 121 of this embodiment can be large. FIG. 7 is a plan view in a case of a pentile array, and FIG. 8 is a plan view in a case of a square array. As in the stripe array shown in FIG. 6, a rise in driving voltage can be suppressed.

Figure 9:
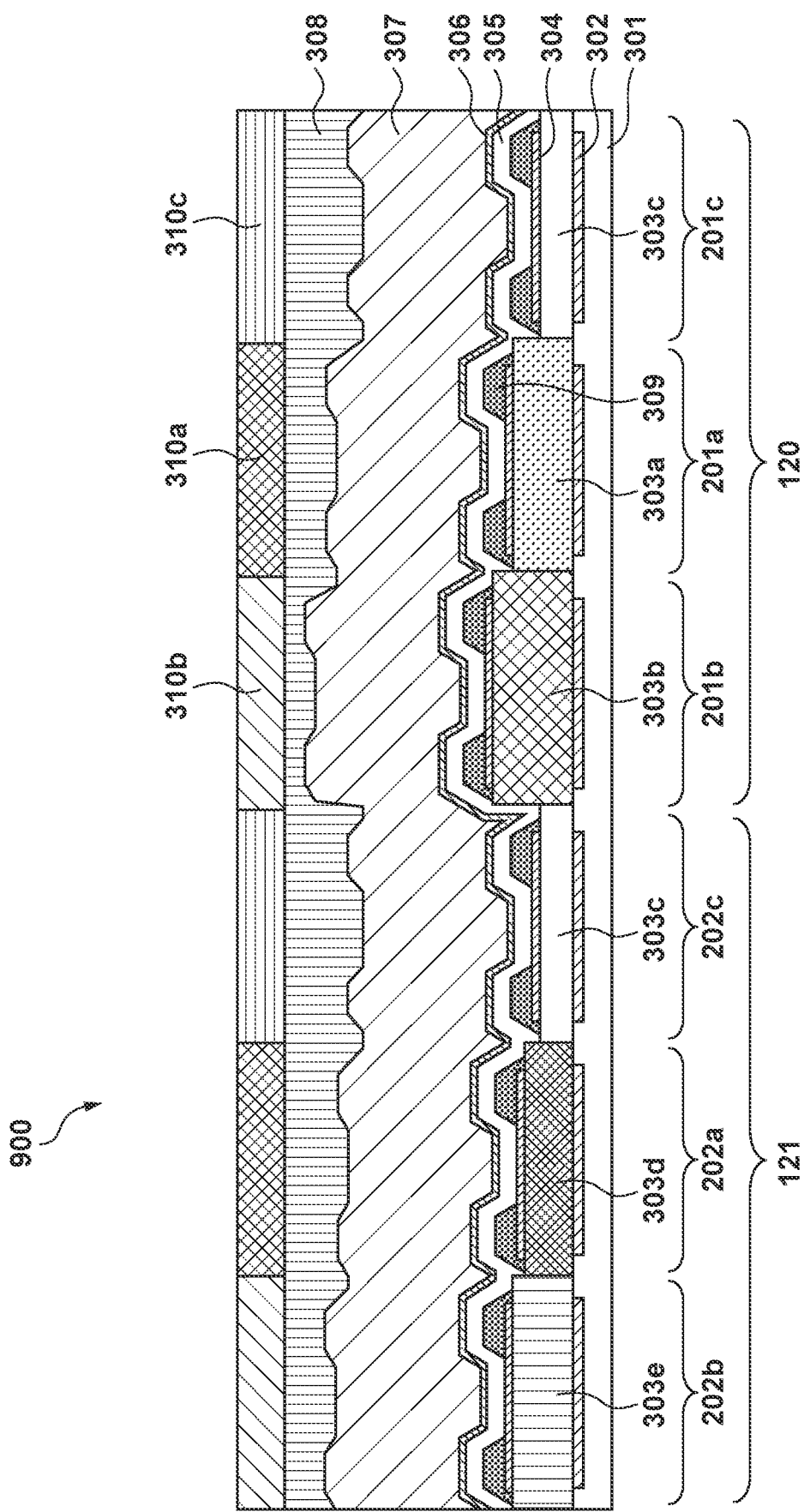
FIG. 9 is a sectional view showing still another modification of the light-emitting device shown in FIG. 2.

With reference to FIG. 9, still another modification of the above-described light-emitting device 100 will be described. FIG. 9 is a plan view showing an arrangement example of a light-emitting device 900 of this embodiment. In the light-emitting device 900, the film thickness of the insulating layer 303 arranged in the dummy element 202 in the dummy region 121 is different among the dummy elements 202a to 202c. An insulating layer 303d is arranged in the dummy element 202a, an insulating layer 303e is arranged in the dummy element 202b, and the insulating layer 303c is arranged in the dummy element 202c. Here, for example, the difference in distance from the reflective layer 302 to the light-emitting layer of the organic layer 305 between any two of the plurality of dummy elements 202a to 202c may be smaller than the difference in distance from the reflective layer 302 to the light-emitting layer of the organic layer 305 between the light-emitting element having the largest distance among the plurality of the light-emitting elements 201a to 201c and the light-emitting element having the smallest distance among them. In the arrangement shown in FIG. 9, the difference in distance from the reflective layer 302 to the light-emitting layer of the organic layer 305 between the dummy element 202b and the light-emitting element 201c may be smaller than the difference in distance from the reflective layer 302 to the light-emitting layer of the organic layer 305 between the light-emitting elements 201b and 201c. In other words, the difference between the film thickness of the insulating layer 303e of the dummy element 202b and the film thickness of the insulating layer 303c of the light-emitting element 201c may be smaller than the difference between the film thickness of the insulating layer 303b of the light-emitting element 201b and the film thickness of the insulating layer 303c of the light-emitting element 201c. Further, for example, the difference in distance from the reflective layer 302 to the light-emitting layer of the organic layer 305 between the dummy elements adjacent to each other among the plurality of the dummy elements 202a to 202c may be smaller than the difference in distance from the reflective layer 302 to the light-emitting layer of the organic layer 305 between the light-emitting elements adjacent to each other among the plurality of the light-emitting elements 201a to 201c. With this arrangement, also in the light-emitting device 900, it is possible to decrease the steps generated on the electrode 306 arranged in the dummy region 121, so that a rise in resistance of the electrode 306 can be suppressed and a rise in driving voltage for driving the light-emitting elements 201 can be suppressed. In addition, even in a case in which an electric current flows in the direction in which there are film thickness differences among the insulating layers 303 as in the light-emitting device 600 described above, it is possible to more suppress a rise in resistance of the electrode 306 in the dummy region 121 of the light-emitting device 900 than in the light-emitting device 110. As a result, it is possible to suppress a rise in driving voltage for driving the light-emitting elements 201.

Here, application examples in which the light-emitting device 100, 400, 500, 600, or 900 (the light-emitting devices 100, 400, 500, 600, and 900 will representatively be referred to as the "light-emitting device 100" hereinafter) of this embodiment is applied to a display device, a photoelectric conversion device, an electronic apparatus, an illumination device, and a mobile body will be described with reference to FIGS. 11 to 16. In addition, the light-emitting device 100 is applicable to the exposure light source of an electrophotographic image forming device, the backlight of a liquid crystal display device, a light-emitting unit including a color filter in a white light source, and the like. The display device may be an image information processing device that includes an image input unit for inputting image information from an area CCD, a linear CCD, a memory card, or the like, and an information processing unit for processing the input information, and displays the input image on a display unit. In addition, a display unit included in a camera or an inkjet printer may have a touch panel function. The driving type of the touch panel function may be an infrared type, a capacitance type, a resistive film type, or an electromagnetic induction type, and is not particularly limited. The display device may be used for the display unit of a multifunction printer.

Figure 11:
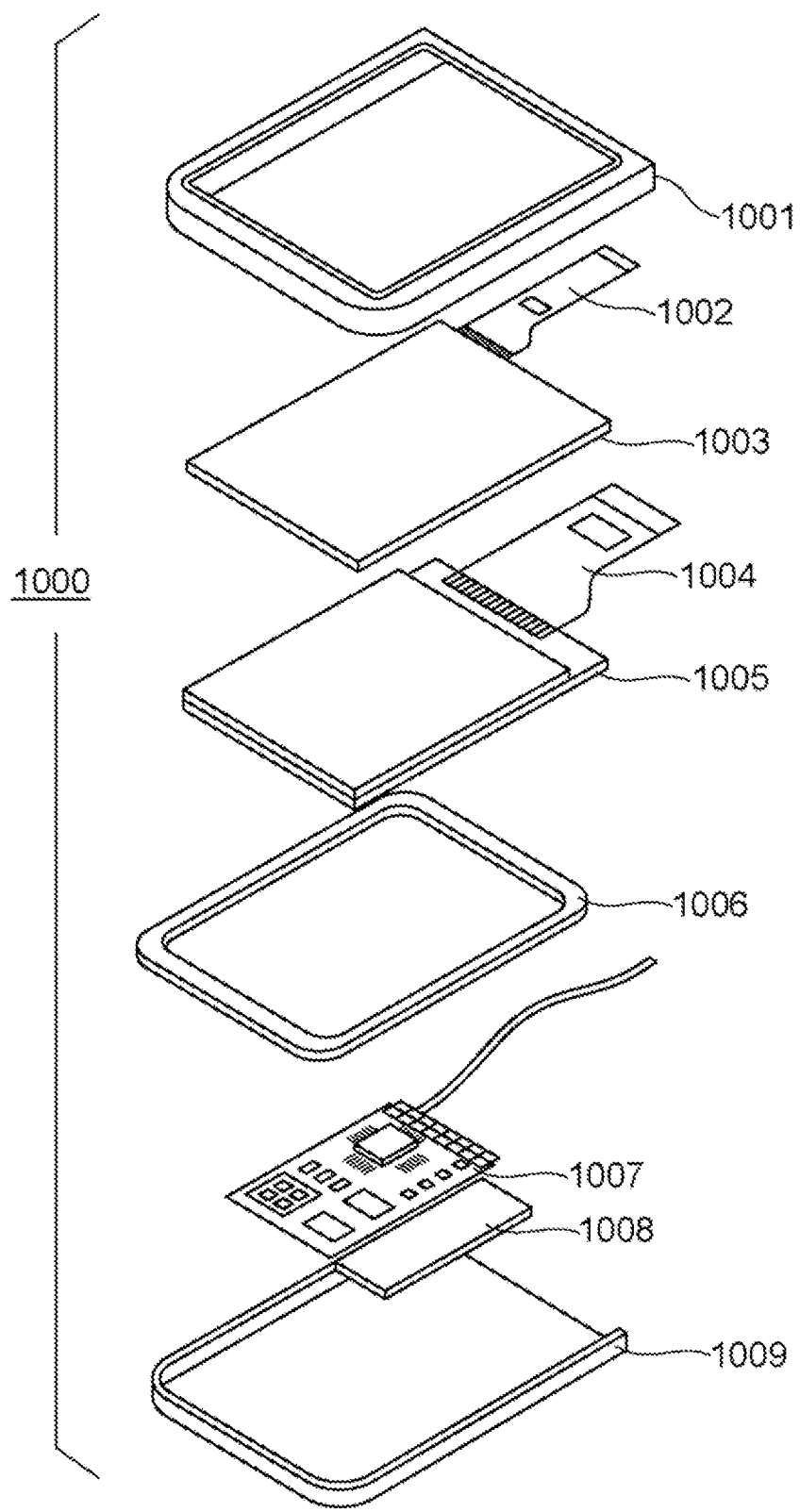
FIG. 11 is a view showing an example of a display device using the light-emitting device shown in FIG. 1.

FIG. 11 is a view schematically showing an example of the display device using the light-emitting device 100 of this embodiment. A display device 1000 may include, between an upper cover 1001 and a lower cover 1009, a touch panel 1003, a display panel 1005, a frame 1006, a circuit board 1007, and a battery 1008. The touch panel 1003 and the display panel 1005 are connected to flexible printed circuit FPCs 1002 and 1004, respectively. Active elements such as transistors are arranged on the circuit board 1007. The battery 1008 may not be provided if the display device 1000 is not a portable device, or need not be provided in this position even if the display device is a portable device. The above-described light-emitting device 100 in which the light-emitting layer of the organic layer 305 includes an organic light-emitting material such as an organic EL material and which functions as a light-emitting unit can be applied to the display panel 1005. The light-emitting device 100 functioning as the display panel 1005 is connected to the active element such as the transistor arranged on the circuit board 1007 to be operated.

The display device 1000 shown in FIG. 11 may be used for the display unit of a photoelectric conversion device (image capturing device) that includes an optical unit including a plurality of lenses and an image sensor that receives light passing through the optical unit and photoelectrically converts the light into an electric signal. The photoelectric conversion device may include a display unit which displays information acquired by the image sensor. The display unit may be a display unit exposed to the outside of the photoelectric conversion device, or a display unit arranged in a viewfinder. The photoelectric conversion device may be a digital camera or a digital video camera.

Figure 12:
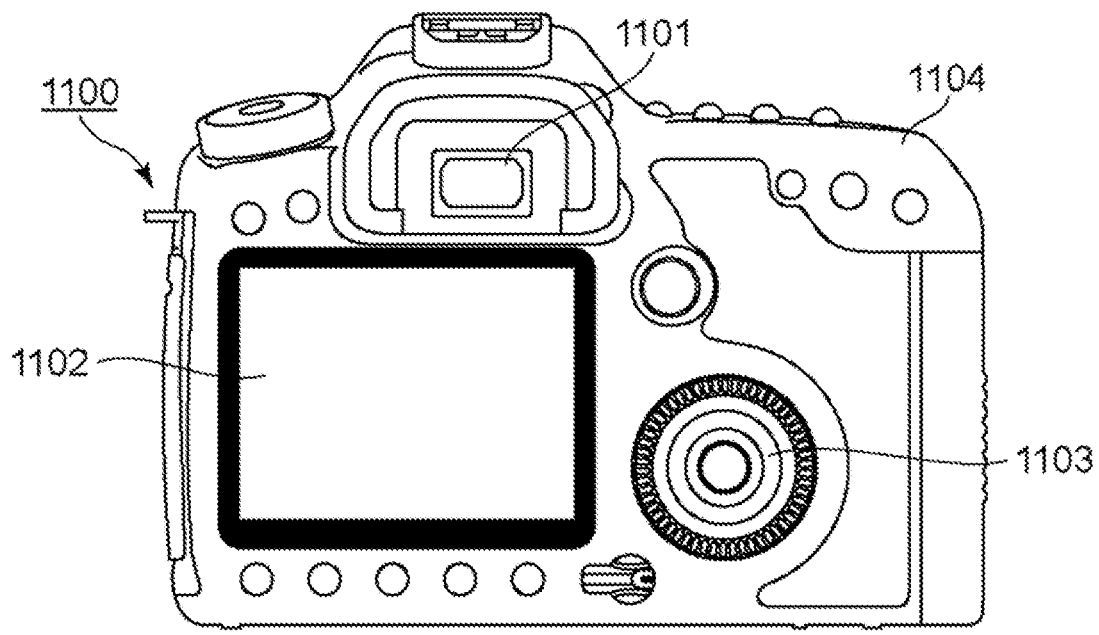
FIG. 12 is a view showing an example of a photoelectric conversion device using the light-emitting device shown in FIG. 1.

FIG. 12 is a view schematically showing an example of a photoelectric conversion device using the light-emitting device 100 of this embodiment. A photoelectric conversion device 1100 may include a viewfinder 1101, a rear display 1102, an operation unit 1103, and a housing 1104. The photoelectric conversion device 1100 can be referred to as an image capturing device. The light-emitting device 100 in which the light-emitting layer of the organic layer 305 includes the organic light-emitting material and which functions as a light-emitting unit can be applied to the viewfinder 1101 serving as the display unit. In this case, the light-emitting device 100 may display not only an image to be captured, but also environment information, an image capturing instruction, and the like. The environment information may include the intensity of ambient light, the direction of ambient light, the moving speed of an object, the possibility that the object is blocked by a shielding object, or the like.

Since the timing suitable for capturing an image is often a short time, it is preferable to display the information as quickly as possible. Therefore, the above-described light-emitting device 100 in which the light-emitting layer of the organic layer 305 includes the organic light-emitting material can be used in the viewfinder 1101 since the organic light-emitting material has a high response speed. The light-emitting device 100 using the organic light-emitting material can be used more suitably than a liquid crystal display device in the devices that require a high display speed.

The photoelectric conversion device 1100 includes an optical unit (not shown). The optical unit includes a plurality of lenses and forms an image on a photoelectric conversion element (not shown), which receives light having passed through the optical unit, housed in the housing 1104. It is possible to adjust the focus by adjusting the relative positions of the plurality of lenses. This operation can be performed automatically.

The above-described light-emitting device 100 in which the light-emitting layer of the organic layer 305 includes the organic light-emitting material and which functions as a light-emitting unit may be applied to the display unit of an electronic apparatus. In this case, the display unit may have both a display function and an operation function. Examples of the mobile terminal include a mobile phone such as a smartphone, a tablet, and a head mounted display.

Figure 13:
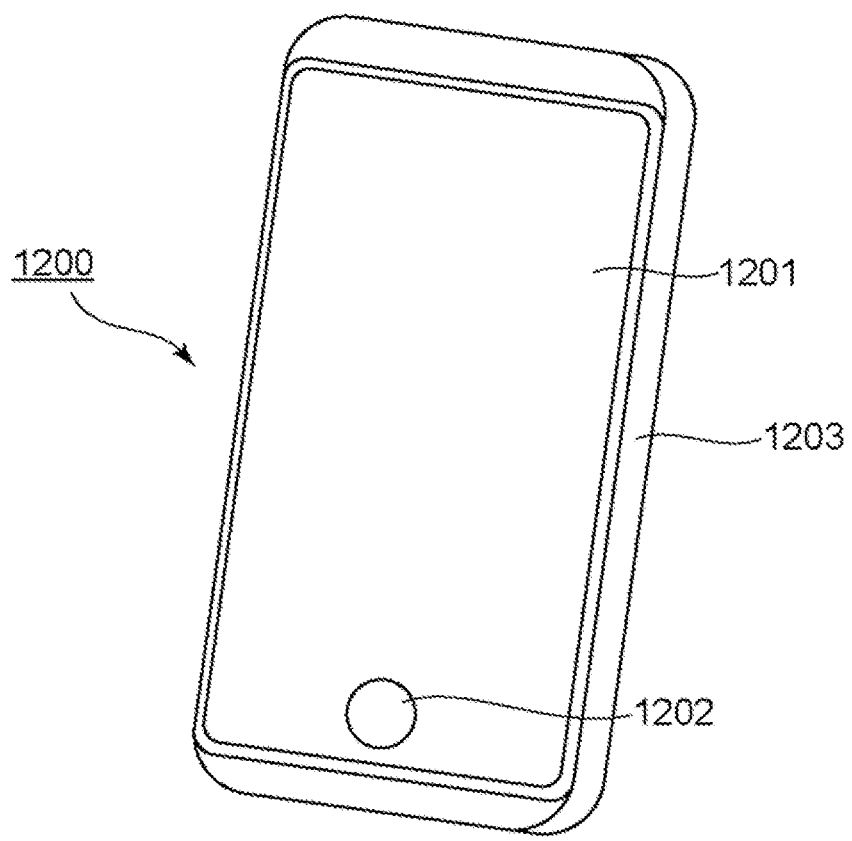
FIG. 13 is a view showing an example of an electronic apparatus using the light-emitting device shown in FIG. 1.

FIG. 13 is a view schematically showing an example of an electronic apparatus using the light-emitting device 100 of this embodiment. An electronic apparatus 1200 includes a display unit 1201, an operation unit 1202, and a housing 1203. The housing 1203 may include a circuit, a printed board including the circuit, a battery, and a communication unit. The operation unit 1202 may be a button or a touch panel type sensing unit. The operation unit 1202 may be a biometrics unit that recognizes a fingerprint and releases a lock or the like. A mobile apparatus including a communication unit can also be called a communication apparatus. The above-described light-emitting device 100 in which the light-emitting layer of the organic layer 305 includes the organic light-emitting material and which functions as a light-emitting unit can be applied to the display unit 1201.

FIGS. 14A and 14B are views schematically showing examples of a display device using the light-emitting device 100 of this embodiment. FIG. 14A shows a display device such as a television monitor or a PC monitor. A display device 1300 includes a frame 1301 and a display unit 1302. The above-described light-emitting device 100 in which the light-emitting layer of the organic layer 305 includes the organic light-emitting material and which functions as a light-emitting unit can be applied to the display unit 1302. The display device 1300 may include a base 1303 that supports the frame 1301 and the display unit 1302. The base 1303 is not limited to the form shown in FIG. 14A. The lower side of the frame 1301 may serve as the base 1303. The frame 1301 and the display unit 1302 may be bent. The curvature radius may be between 5,000 mm (inclusive) and 6,000 mm (inclusive).

FIG. 14B is a view schematically showing another example of the display device using the light-emitting device 100 of this embodiment. A display device 1310 shown in FIG. 14B is configured to be bendable, and is a so-called foldable display device. The display device 1310 includes a first display unit 1311, a second display unit 1312, a housing 1313, and a bending point 1314. The above-described light-emitting device 100 in which the light-emitting layer of the organic layer 305 includes the organic light-emitting material and which functions as a light-emitting unit can be applied to each of the first display unit 1311 and the second display unit 1312. The first display unit 1311 and the second display unit 1312 may be one seamless display device. The first display unit 1311 and the second display unit 1312 can be divided at the bending point. The first display unit 1311 and the second display unit 1312 may display different images, or one image may be displayed with the first display unit and the second display unit.

FIG. 15 is a view schematically showing an example of an illumination device using the light-emitting device 100 of this embodiment. An illumination device 1400 may include a housing 1401, a light source 1402, a circuit board 1403, an optical film 1404, and a light diffusion unit 1405. The above-described light-emitting device 100 in which the light-emitting layer of the organic layer 305 includes the organic light-emitting material and which functions as a light-emitting unit can be applied to the light source 1402. The optical film 1404 may be a filter that improves the color rendering property of the light source. The light diffusion unit 1405 can effectively diffuse light from the light source to illuminate a wide range for lighting up or the like. A cover may be provided in the outermost portion, as needed. The illumination device 1400 may include both the optical film 1404 and the light diffusion unit 1405, or may include only one of them.

The illumination device 1400 is, for example, a device that illuminates a room. The illumination device 1400 may emit light of white, day white, or any other color from blue to red. The illumination device 1400 may include a light control circuit for controlling the light color. The illumination device 1400 may include a power supply circuit connected to the light-emitting device 100 which functions as the light source 1402. The power supply circuit is a circuit that converts an AC voltage into a DC voltage. Note that white light has a color temperature of 4200K, and day-white light has a color temperature of 5000K. The illumination device 1400 may also include a color filter. Further, the illumination device 1400 may include a heat dissipation portion. The heat dissipation portion releases the heat in the device to the outside of the device, and examples thereof include a metal having high specific heat, liquid silicon, and the like.

Figure 16:
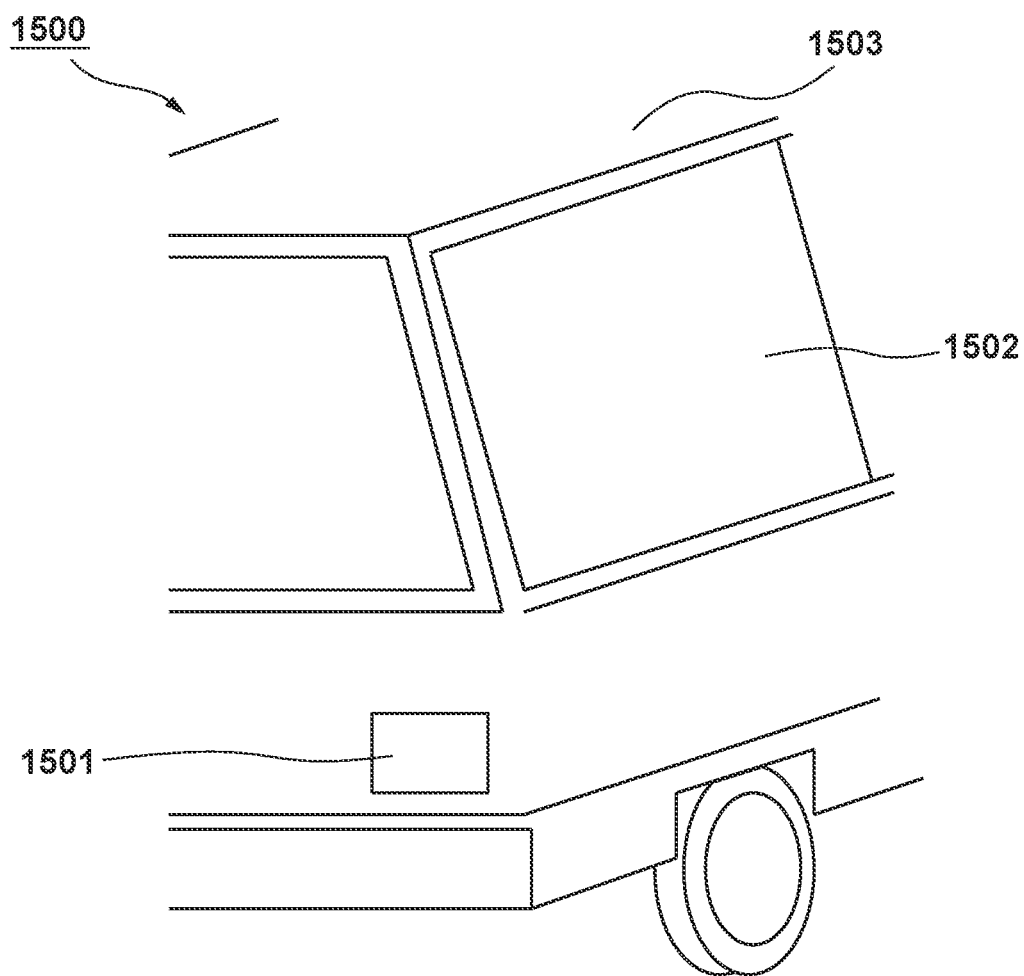
FIG. 16 is a view showing an example of a mobile body using the light-emitting device shown in FIG. 1.

FIG. 16 is a view schematically showing an automobile including a tail lamp which is an example of the lighting unit for an automobile using the light-emitting device 100 of this embodiment. An automobile 1500 includes a tail lamp 1501, and may turn on the tail lamp 1501 when a brake operation or the like is performed. The light-emitting device 100 of this embodiment may be used in a head lamp as the lighting unit for an automobile. The automobile is an example of a mobile body, and the mobile body may be a ship, a drone, an aircraft, a railroad car, or the like. The mobile body may include a body and a lighting unit provided in the body. The lighting unit may inform the current position of the body.

The above-described light-emitting device 100 in which the light-emitting layer of the organic layer 305 includes the organic light-emitting material and which functions as a light-emitting unit can be applied to the tail lamp 1501. The tail lamp 1501 may include a protective member that protects the light-emitting device 100 which functions as the tail lamp 1501. The protective member has a certain degree of strength, and can be made from any material as long as it is transparent. The protective member may be made from polycarbonate or the like. Further, the protective member may be made from polycarbonate mixed with furandicarboxylic acid derivative, acrylonitrile derivative, or the like.

The automobile 1500 may include a body 1503 and windows 1502 attached thereto. The window may be a window for checking the front or rear of the automobile, or may a transparent display. The above-described light-emitting device 100 in which the light-emitting layer of the organic layer 305 includes the organic light-emitting material and which functions as a light-emitting unit may be used in the transparent display. In this case, the components such as the electrodes included in the light-emitting device 100 are formed by transparent members.

The present invention is not limited to the above embodiments and various changes and modifications can be made within the spirit and scope of the present invention. Therefore, to apprise the public of the scope of the present invention, the following claims are made.

According to some embodiments of the present invention, it is possible to provide a technique advantageous in improving the reliability of a light-emitting device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-190459, filed Oct. 17, 2019, which is hereby incorporated by reference herein in its entirety.

What is claimed is:

1. A light-emitting device comprising a display region for displaying an image in which a first light-emitting element and a second light-emitting element are arranged, and a dummy region in which a first dummy element and a second dummy element are arranged and which does not display an image,
    wherein each of the first light-emitting element, the second light-emitting element, the first dummy element, and the second dummy element includes a reflective layer arranged on a substrate, a first electrode arranged above the reflective layer, a light-emitting layer arranged above the first electrode, and a second electrode arranged above the light-emitting layer,
    wherein a distance from the reflective layer to the light-emitting layer in the first light-emitting element is different from a distance from the reflective layer to the light-emitting layer in the second light-emitting element,
    wherein a difference between the distance from the reflective layer to the light-emitting layer in the first light-emitting element and the distance from the reflective layer to the light-emitting layer in the second light-emitting element is set as a first difference,
    wherein a difference between a distance from the reflective layer to the light-emitting layer in the first dummy element and a distance from the reflective layer to the light-emitting layer in the second dummy element is set as a second difference,
    wherein the second difference is less than the first difference,
    wherein each of the first light-emitting element, the second light-emitting element, the first dummy element, and the second dummy element further includes a color filter arranged above the second electrode, and
    wherein the color filter that transmits light having a wavelength different from a wavelength of light that resonates between the reflective layer and the light-emitting layer is arranged on each of the first dummy element and the second dummy element.

2. The device according to claim 1, wherein the distance from the reflective layer to the light-emitting layer in the first dummy element is equal to the distance from the reflective layer to the light-emitting layer in the second dummy element.

3. The device according to claim 1, wherein the distance from the reflective layer to the light-emitting layer in the first dummy element is different from the distance from the reflective layer to the light-emitting layer in the second dummy element.

4. The device according to claim 1, wherein the dummy region is arranged so as to surround the display region.

5. The device according to claim 1, wherein the second electrode is shared by the first light-emitting element, the second light-emitting element, the first dummy element, and the second dummy element, and
    wherein the light-emitting device further comprises a contact region configured to supply a potential to the second electrode such that the dummy region is arranged between the contact region and the display region.

6. The device according to claim 4, wherein the second electrode is shared by the first light-emitting element, the second light-emitting element, the first dummy element, and the second dummy element,
    wherein the light-emitting device further comprises a contact region configured to supply a potential to the second electrode such that the dummy region is arranged between the contact region and the display region, and
    wherein the contact region is arranged so as to surround the dummy region.

7. The device according to claim 5, wherein the light-emitting device comprises a plurality of the first light-emitting elements and a plurality of the second light-emitting elements,
    wherein, in a first direction, any one of the plurality of the second light-emitting elements is arranged between the first light-emitting elements adjacent to each other among the plurality of the first light-emitting elements,
    wherein, in a second direction intersecting the first direction, at least either of the plurality of the first light-emitting elements and the plurality of the second light-emitting elements are continuously arranged, and
    wherein the contact region is arranged along the second direction outside an outer edge of the dummy region intersecting the first direction.

8. The device according to claim 3, wherein the second electrode is shared by the first light-emitting element, the second light-emitting element, the first dummy element, and the second dummy element,
    wherein the light-emitting device further comprises a contact region configured to supply a potential to the second electrode such that the dummy region is arranged between the contact region and the display region,
    wherein the light-emitting device comprises a plurality of the first light-emitting elements, a plurality of the second light-emitting elements, a plurality of the first dummy elements, and a plurality of the second dummy elements,
    wherein, in a first direction, any one of the plurality of the second light-emitting elements is arranged between the first light-emitting elements adjacent to each other among the plurality of the first light-emitting elements, and any one of the plurality of the second dummy elements is arranged between the first dummy elements adjacent to each other among the plurality of the first dummy elements,
    wherein in a second direction intersecting the first direction, at least either of the plurality of the first light-emitting elements and the plurality of the second light-emitting elements are continuously arranged, and at least either of the plurality of the first dummy elements and the plurality of the second dummy elements are continuously arranged, and
    wherein the contact region is arranged along the second direction outside an outer edge of the dummy region intersecting the first direction.

9. The device according to claim 1, wherein in each of the first dummy element and the second dummy element, the light that resonates between the reflective layer and the light-emitting layer and the light that is transmitted by the color filter arranged on the dummy element have a complementary color relationship.

10. The device according to claim 1, wherein among the color filters, the color filters arranged on the first dummy element and the second dummy element have a same color.

11. The device according to claim 1, wherein the light-emitting device further comprises, between the display region and the dummy region, an intermediate region in which a first intermediate dummy element and a second intermediate dummy element are arranged and which does not display an image,
    wherein a distance from the reflective layer to the light-emitting layer in the first intermediate dummy element is different from a distance from the reflective layer to the light-emitting layer in the second intermediate dummy element, and
    wherein a difference between the distance from the reflective layer to the light-emitting layer in the first intermediate dummy element and the distance from the reflective layer to the light-emitting layer in the second intermediate dummy element is set as a third difference,
    wherein the first difference is equal to the third difference.

12. The device according to claim 11, wherein in the display region, a plurality of the first light-emitting elements and a plurality of the second light-emitting elements are arrayed in a predetermined order,
    wherein in the intermediate region, a plurality of the first intermediate dummy elements and a plurality of the second intermediate dummy elements are arrayed in a predetermined order, and
    wherein a relationship regarding an arrangement order of the plurality of the first light-emitting elements and the plurality of the second light-emitting elements in the display region and the distances between the reflective layers and the light-emitting layer of the first light-emitting element and the second light-emitting element is similar to a relationship regarding the arrangement order of the plurality of the first intermediate dummy elements and the plurality of the second intermediate dummy elements in the intermediate region and the distances between the reflective layers and the light-emitting layer of the first intermediate dummy element and the second intermediate dummy element.

13. The device according to claim 11, wherein the display region comprises a plurality of light-emitting elements including the first light-emitting element and the second light-emitting element,
    wherein the dummy region comprises a plurality of dummy elements including the first dummy element and the second dummy element,
    wherein the intermediate region comprises a plurality of intermediate dummy elements including the first intermediate dummy element and the second intermediate dummy element, and
    wherein the number of the intermediate dummy elements, among the plurality of intermediate dummy elements, arranged between the light-emitting element that is arranged at an outer edge of the display region among the plurality of light-emitting elements and the dummy element that is closest to the light-emitting element among the plurality of dummy elements is between, and inclusive of, two and ten.

14. A display device comprising a light-emitting device defined in claim 1, and an active element connected to the light-emitting device.

15. A photoelectric conversion device comprising an optical unit including a plurality of lenses, an image sensor configured to receive light passing through the optical unit, and a display unit configured to display an image,
wherein the display unit is configured to display an image captured by the image sensor, and includes a light-emitting device defined in claim 1.

16. An electronic apparatus comprising a housing provided with a display unit, and a communication unit provided in the housing and configured to communicate with the outside,
wherein the display unit includes a light-emitting device defined in claim 1.

17. An illumination device comprising a light source, and at least one of a light diffusion unit and an optical film,
wherein the light source includes a light-emitting device defined in claim 1.

18. A mobile body comprising a body and a lighting unit provided in the body, wherein the lighting unit includes a light-emitting device defined in claim 1.

19. A light-emitting device comprising a display region for displaying an image in which a first light-emitting element and a second light-emitting element are arranged, and a dummy region in which a first dummy element and a second dummy element are arranged and which does not display an image,
wherein each of the first light-emitting element, the second light-emitting element, the first dummy element, and the second dummy element includes a reflective layer arranged on a substrate, a first electrode arranged above the reflective layer, a light-emitting layer arranged above the first electrode, and a second electrode arranged above the light-emitting layer,
wherein a distance from the reflective layer to the light-emitting layer in the first light-emitting element is different from a distance from the reflective layer to the light-emitting layer in the second light-emitting element,
wherein a difference between the distance from the reflective layer to the light-emitting layer in the first light-emitting element and the distance from the reflective layer to the light-emitting layer in the second light-emitting element is set as a first difference,
wherein a difference between a distance from the reflective layer to the light-emitting layer in the first dummy element and a distance from the reflective layer to the light-emitting layer in the second dummy element is set as a second difference,
wherein the second difference is less than the first difference,
wherein the light-emitting device further comprises, between the display region and the dummy region, an intermediate region in which a first intermediate dummy element and a second intermediate dummy element are arranged and which does not display an image,
wherein a distance from the reflective layer to the light-emitting layer in the first intermediate dummy element is different from a distance from the reflective layer to the light-emitting layer in the second intermediate dummy element,
wherein a difference between the distance from the reflective layer to the light-emitting layer in the first intermediate dummy element and the distance from the reflective layer to the light-emitting layer in the second intermediate dummy element is set as a third difference, and
wherein the first difference is equal to the third difference.

20. The device according to claim 19, wherein in the display region, a plurality of the first light-emitting elements and a plurality of the second light-emitting elements are arrayed in a predetermined order,
wherein in the intermediate region, a plurality of the first intermediate dummy elements and a plurality of the second intermediate dummy elements are arrayed in a predetermined order, and
wherein a relationship regarding an arrangement order of the plurality of the first light-emitting elements and the plurality of the second light-emitting elements in the display region and the distances between the reflective layers and the light-emitting layer of the first light-emitting element and the second light-emitting element is similar to a relationship regarding the arrangement order of the plurality of the first intermediate dummy elements and the plurality of the second intermediate dummy elements in the intermediate region and the distances between the reflective layers and the light-emitting layer of the first intermediate dummy element and the second intermediate dummy element.

21. The device according to claim 19, wherein the display region comprises a plurality of light-emitting elements including the first light-emitting element and the second light-emitting element,
wherein the dummy region comprises a plurality of dummy elements including the first dummy element and the second dummy element,
wherein the intermediate region comprises a plurality of intermediate dummy elements including the first intermediate dummy element and the second intermediate dummy element, and
wherein the number of the intermediate dummy elements, among the plurality of intermediate dummy elements, arranged between the light-emitting element that is arranged at an outer edge of the display region among the plurality of light-emitting elements and the dummy element that is closest to the light-emitting element among the plurality of dummy elements is between, and inclusive of, two and ten.

22. A display device comprising a light-emitting device defined in claim 19, and an active element connected to the light-emitting device.

23. A photoelectric conversion device comprising an optical unit including a plurality of lenses, an image sensor configured to receive light passing through the optical unit, and a display unit configured to display an image,
wherein the display unit is configured to display an image captured by the image sensor, and includes a light-emitting device defined in claim 19.

* * * * *